(12) United States Patent
Rueckes et al.

(10) Patent No.: US 7,911,831 B2
(45) Date of Patent: Mar. 22, 2011

(54) NANOTUBE-ON-GATE FET STRUCTURES AND APPLICATIONS

(75) Inventors: Thomas Rueckes, Rockport, MA (US); Brent M. Segal, Woburn, MA (US); Bernhard Vogeli, Zollikon (CH); Darren K. Brock, Woburn, MA (US); Venkatachalam C. Jaiprakash, Fremont, CA (US); Claude L. Bertin, Burlington, VT (US)

(73) Assignee: Nantero, Inc., Woburn, MA (US)

( * ) Notice: Subject to any disclaimer, the term of this patent is extended or adjusted under 35 U.S.C. 154(b) by 798 days.

(21) Appl. No.: 11/939,316

(22) Filed: Nov. 13, 2007

(65) Prior Publication Data
US 2010/0283528 A1 Nov. 11, 2010

Related U.S. Application Data

(63) Continuation of application No. 10/811,373, filed on Mar. 26, 2004, now Pat. No. 7,294,877.

(60) Provisional application No. 60/459,224, filed on Mar. 28, 2003.

(51) Int. Cl.
*G11C 11/50* (2006.01)
(52) U.S. Cl. . 365/164; 257/298; 257/300; 257/E23.165; 257/E51.04
(58) Field of Classification Search .......... 257/296, 257/298, 300, 312, E51.038, E51.04, E23.074, 257/E23.165; 365/164
See application file for complete search history.

(56) References Cited

U.S. PATENT DOCUMENTS

| | | | |
|---|---|---|---|
| 6,128,214 A | 10/2000 | Kuekes et al. | |
| 6,256,767 B1 | 7/2001 | Kuekes et al. | |
| 6,314,019 B1 | 11/2001 | Kuekes et al. | |
| 6,423,583 B1 | 7/2002 | Avouris et al. | |
| 6,445,006 B1 | 9/2002 | Brandes et al. | |

(Continued)

FOREIGN PATENT DOCUMENTS
GB 2 364 933 A 2/2002
(Continued)

OTHER PUBLICATIONS

Avouris, P., et al., "Carbon Nanotube Electronics," Chemical Physics, 2002, vol. 284, pp. 429-445.

(Continued)

*Primary Examiner* — Evan Pert
*Assistant Examiner* — Eduardo A Rodela
(74) *Attorney, Agent, or Firm* — Wilmer Cutler Pickering; Hale and Dorr LLP

(57) ABSTRACT

Under one aspect, non-volatile transistor device includes a source and drain with a channel in between; a gate structure made of a semiconductive or conductive material disposed over an insulator over the channel; a control gate made of a semiconductive or conductive material; and an electromechanically-deflectable nanotube switching element in fixed contact with one of the gate structure and the control gate structure and is not in fixed contact with the other of the gate structure and the control gate structure. The device has a network of inherent capacitances, including an inherent capacitance of an undeflected nanotube switching element in relation to the gate structure. The network is such that the nanotube switching element is deflectable into contact with the other of the gate structure and the control gate structure in response to signals being applied to the control gate and one of the source region and drain region.

23 Claims, 22 Drawing Sheets

U.S. PATENT DOCUMENTS

| | | | |
|---|---|---|---|
| 6,515,339 | B2 | 2/2003 | Shin et al. |
| 6,548,841 | B2 | 4/2003 | Frazier et al. |
| 6,707,098 | B2 | 3/2004 | Hofmann et al. |
| 6,759,693 | B2 | 7/2004 | Vogeli et al. |
| 6,803,840 | B2 | 10/2004 | Hunt et al. |
| 6,809,465 | B2 | 10/2004 | Jin |
| 6,918,284 | B2 | 7/2005 | Snow et al. |
| 6,919,592 | B2 | 7/2005 | Segal |
| 6,919,740 | B2 | 7/2005 | Snider |
| 6,955,937 | B1 | 10/2005 | Burke et al. |
| 6,969,651 | B1 | 11/2005 | Lu et al. |
| 6,990,009 | B2 | 1/2006 | Bertin et al. |
| 7,015,500 | B2 | 3/2006 | Choi et al. |
| 7,115,901 | B2 | 10/2006 | Bertin et al. |
| 7,115,960 | B2 | 10/2006 | Bertin |
| 7,161,403 | B2 | 1/2007 | Bertin |
| 7,274,078 | B2 * | 9/2007 | Jaiprakash et al. ............ 257/414 |
| 7,294,877 | B2 | 11/2007 | Rueckes et al. |
| 2001/0023986 | A1 | 9/2001 | Mancevski |
| 2002/0175390 | A1 | 11/2002 | Goldstein et al. |
| 2003/0200521 | A1 | 10/2003 | DeHon et al. |
| 2005/0056877 | A1 | 3/2005 | Rueckes et al. |
| 2006/0183278 | A1 | 8/2006 | Bertin et al. |
| 2006/0237537 | A1 | 10/2006 | Empedocles et al. |

FOREIGN PATENT DOCUMENTS

| | | |
|---|---|---|
| WO | WO-00/48195 | 8/2000 |
| WO | WO-01/03208 A1 | 1/2001 |

OTHER PUBLICATIONS

Batchtold, A., et al., "Logic circuits cased on carbon nanotubes," *Physica E*, 2003, vol. 16, pp. 42-46.

Chen, J. et al., "Self-aligned carbon nanotube transistors with charge transfer doping", *Applied Physics Letters*, vol. 86, pp. 123108-1-123108-3, 2005.

Chen, J. et al., "Self-aligned Carbon Nanotube Transistors with Novel Chemical Doping", *IEDM*, pp. 29.4.1-29.4.4, 2004.

Derycke, V. et al., "Controlling doping and carrier injection in carbon nanotube transistors", *Applied Physics Letters*, vol. 80, No. 15, pp. 2773-2775, Apr. 15, 2002.

Derycke, V., et al., "Carbon Nanotube Inter- and Intramolecular Logic Gates," *Nano Letters*, Sep. 2001, vol. 1, No. 9, pp. 453-456.

Duan, X. et al., "Nonvolatile Memory and Programmable Logic from Molecule-Gated Nanowires", *Nano Letters*, vol. 0, No. 0, pp. A-D, 2002.

European Patent Office Communication, dated Feb. 1, 2008, European Patent Application No. 04 758 373.7-1233, 6 pages.

Heinze, S. et al., "Carbon Nanotubes as Schottky Barrier Transistsors", *Physical Review Letters*, vol. 89, No. 10, pp. 16801-1-106801-4, 2002.

Huang, Y., et al,, "Logic Gates and Computation from Assembled Nanowire Building Blocks," *Science*, Nov. 9, 2001, vol. 294, pp. 1313-1316.

Javey, A. et al., "Carbon Nanotube Field-Effect Transistors with Integrated Ohmic Contacts and High-k Gate Dielectrics", *Nano Letters*, vol. 4, No. 3, pp. 447-450, 2004.

Javey, A. et al., "High-k dielectrics for advanced carbon-nanotube transistors and logic gates", *Nature Materials*, vol. 1, pp. 241-246, Dec. 2002.

Javey, A., et al., "Carbon Nanotube Transistor Arrays for Multistage Complementary Logic and Ring Oscillators," *Nano Letters*, 2002, vol. 2 , No. 9, pp. 929-932.

Lin, Y.M. et al., "Novel Carbon Nanotube FET Design with Tunable Polarity", *IEDM*, pp. 29.2.1-29.2.4, 2004.

Luyken, R. J. et al., "Concepts for hybrid CMOS-molecular nonvolatile memories", *Nanotechnology*, vol. 14, pp. 273-276, 2003.

Martel, R., et al, "Carbon Nanotube Field-Effect Transistors and Logic Circuits," *DAC 2002*, Jun. 10-12, 2002, vol. 7.4, pp. 94-98.

Radosavljevic, M. et al., "Nonvolatile Molecular Memory Elements Based on Ambipolar Nanotube Field Effect Transistors", Nano Letters, 2002. 2 (7) 761-764. cited by other.

Rueckes, T., et al., "Carbon Nanotube-Based Nonvolatile Random Access Memory for Molecular Computing", Science, vol. 289, Issue 5476, Jul. 7, 2000, pp. 94-97.

Wind, S. J. et al., "Fabrication and Electrical Characterization of Top Gate Single-Wall Carbon Nanotube Field-Effect Transistors", 14 pages.

Wind, S. J. et al., "Vertical scaling of carbon nanotube field-effect transistors using top gate electrodes", *Applied Physics Letters*, vol. 80, No. 20, pp. 3817-3819, May 20, 2002.

\* cited by examiner

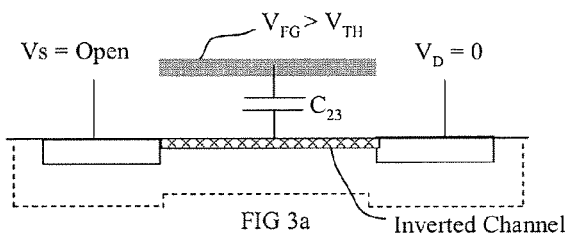
FIG 3a
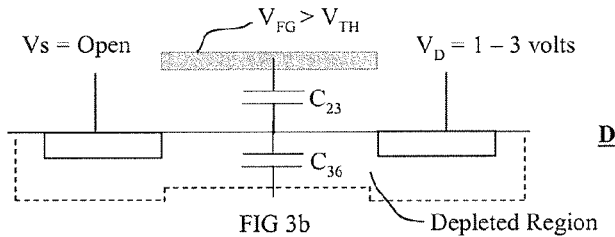
FIG 3b
CHANNEL REGION MODULATION 
Inverted Channel: electrons at $V_D = 0$ volts
Depleted Channel: electrons flow
to positive terminal

NET: NT SELECT (WRITE) VOLTAGE THRESHOLD RANGE 1.0 v < $V_{NT\,TH}$ < 2.0 v

NT SWITCH OPEN

NT SWITCH CLOSED

NT SWITCH OPEN

NT SWITCH CLOSED

NT SWITCH OPEN

NT SWITCH CLOSED

NT SWITCH OPEN

NT SWITCH CLOSED

NANOTUBE-ON-GATE FET STRUCTURES AND APPLICATIONS

CROSS-REFERENCE TO RELATED APPLICATIONS

This application is a continuation of, and claims priority under 35 U.S.C. §120 to U.S. patent application Ser. No. 10/811,373, filed on Mar. 26, 2004 and entitled Nanotube-On-Gate FET Structures and Applications, which is incorporated herein by reference in its entirety, which claims priority under 35 U.S.C. §119(e) to U.S. Provisional Patent Application. No. 60/459,224, filed on Mar. 28, 2003, entitled Nanotube-On-Gate FET Structures and Applications, which is incorporated herein by reference in its entirety.

This application is related to the following U.S. applications, the contents of which are incorporated herein in their entirety by reference:

- U.S. Provisional Patent Application No. 60/459,223 filed on Mar. 28, 2003, entitled NRAM Bit Selectable Two-Device Nanotube Array;
- U.S. patent application Ser. No. 10/810,962, now U.S. Pat. No. 6,944,054, filed on Mar. 26, 2004, entitled NRAM Bit Selectable Two-Device Nanotube Array;
- U.S. Provisional Patent Application No. 60/459,253, filed on Mar. 28, 2003, entitled Single Transistor with Integrated Nanotube (NT-FET);
- U.S. patent application Ser. No. 10/811,191, now U.S. Pat. No. 7,075,141, filed on Mar. 26, 2004, entitled Four Terminal Non-Volatile Transistor Device;
- U.S. Provisional Patent Application No. 60/459,222, filed on Mar. 28, 2003, entitled Non-Volatile RAM Cell and Array using Nanotube Switch Position for Information State; and
- U.S. patent application Ser. No. 10/810,963, now U.S. Pat. No. 7,113,426, filed on Mar. 26, 2004, entitled Non-Volatile RAM Cell and Array Using Nanotube Switch Position for Information State.

BACKGROUND

1. Technical Field

The invention relates to non-volatile transistors structures and more specifically to non-volatile transistors using nanotube (NT) components.

2. Discussion of Related Art

Important characteristics for a memory cell in electronic device are low cost, nonvolatility, high density, low power, and high speed. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM) and Static Random Access Memory (SRAM).

ROM is relatively low cost but cannot be rewritten. PROM can be electrically programmed but with only a single write cycle. EPROM has read cycles that are fast relative to ROM and PROM read cycles, but has relatively long erase times and reliability only over a few iterative read/write cycles. EEPROM (or "Flash") is inexpensive, and has low power consumption but has long write cycles (ms) and low relative speed in comparison to DRAM or SRAM. Flash also has a finite number of read/write cycles leading to low long-term reliability. ROM, PROM, EPROM and EEPROM are all non-volatile, meaning that if power to the memory is interrupted the memory will retain the information stored in the memory cells.

DRAM stores charge on transistor gates that act as capacitors but must be electrically refreshed every few milliseconds complicating system design by requiring separate circuitry to "refresh" the memory contents before the capacitors discharge. SRAM does not need to be refreshed and is fast relative to DRAM, but has lower density and is more expensive relative to DRAM. Both SRAM and DRAM are volatile, meaning that if power to the memory is interrupted the memory will lose the information stored in the memory cells.

Consequently, existing technologies are either non-volatile but are not randomly accessible and have low density, high cost, and limited ability to allow multiples writes with high reliability of the circuit's function, or they are volatile and complicate system design or have low density. Some emerging technologies have attempted to address these shortcomings.

For example, magnetic RAM (MRAM) or ferromagnetic RAM (FRAM) utilizes the orientation of magnetization or a ferromagnetic region to generate a nonvolatile memory cell. MRAM utilizes a magnetoresistive memory element involving the anisotropic magnetoresistance or giant magnetoresistance of ferromagnetic materials yielding nonvolatility. Both of these types of memory cells have relatively high resistance and low-density. A different memory cell based upon magnetic tunnel junctions has also been examined but has not led to large-scale commercialized MRAM devices. FRAM uses a circuit architecture similar to DRAM but which uses a thin film ferroelectric capacitor. This capacitor is purported to retain its electrical polarization after an externally applied electric field is removed yielding a nonvolatile memory. FRAM suffers from a large memory cell size, and it is difficult to manufacture as a large-scale integrated component. See U.S. Pat. Nos. 4,853,893; 4,888,630; 5,198,994

Another technology having non-volatile memory is phase change memory. This technology stores information via a structural phase change in thin-film alloys incorporating elements such as selenium or tellurium. These alloys are purported to remain stable in both crystalline and amorphous states allowing the formation of a bi-stable switch. While the nonvolatility condition is met, this technology appears to suffer from slow operations, difficulty of manufacture and reliability and has not reached a state of commercialization. See U.S. Pat. Nos. 3,448,302; 4,845,533; 4,876,667; 6,044,008.

Wire crossbar memory (MWCM) has also been proposed. See U.S. Pat. Nos. 6,128,214; 6,159,620; 6,198,655. These memory proposals envision molecules as bi-stable switches. Two wires (either a metal or semiconducting type) have a layer of molecules or molecule compounds sandwiched in between. Chemical assembly and electrochemical oxidation or reduction are used to generate an "on" or "off" state. This faun of memory requires highly specialized wire junctions and may not retain non-volatility owing to the inherent instability found in redox processes.

Recently, memory devices have been proposed which use nanoscopic wires, such as single-walled carbon nanotubes, to form crossbar junctions to serve as memory cells. See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 Jul. 2000. Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The NTWCM proposals to date rely on directed growth or chemical self-assembly techniques to grow the individual nanotubes needed for the memory cells. These techniques are now believed to be difficult to employ at commercial scales using modern technology. Moreover, they may contain inherent limitations such as the length of the nanotubes that may be grown reliably using these techniques, and it may difficult to control the statistical variance of geometries of nanotube wires so grown.

The ideal memory for at least some purposes is one which would offer low cost per bit, high density, fast random access, read/write cycle times of equal duration, low power consumption, operation over a wide temperature range, a single low-voltage power supply, with a high degree of radiation tolerance. The non-volatile described herein cell offers high speed read, but also high speed write (nanosecond) versus the slow (microsecond & millisecond) write time of EEPROM and FLASH EEPROM type of memories. The memory is much denser than conventional SRAM because it has a two device, NT and 3 array line structure, and offers competitive performance. The density is less than that of DRAM cells, however, the product offers NDRO operation and non-volatility.

U.S. Patent Publication No. 2003-0021966 discloses, among other things, electromechanical circuits, such as memory cells, in which circuits include a structure having electrically conductive traces and supports extending from a surface of a substrate. Nanotube ribbons are suspended by the supports that cross the electrically conductive traces. Each ribbon comprises one or more nanotubes. The ribbons are formed from selectively removing material from a layer or matted fabric of nanotubes.

For example, as disclosed in U.S. Patent Application Publication No. 2003-0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. Patent Application Publication No. 2003-0124325, three-trace architectures may be used for electromechanical memory cells, in which the two of the traces are electrodes to control the deflection of the ribbon.

SUMMARY

The invention provides nanotube on gate FET structures and applications of such, including $n^2$ crossbars requiring only 2n control lines.

According to one aspect of the invention, a non-volatile transistor device includes a source region and a drain region of a first semiconductor type of material and a channel region of a second semiconductor type of material disposed between the source and drain region. A gate structure is made of at least one of semiconductive or conductive material and is disposed over an insulator over the channel region. A control gate is made of at least one of semiconductive or conductive material. An electromechanically-deflectable nanotube switching element is in fixed contact with one of the gate structure and the control gate structure and is not in fixed contact with the other of the gate structure and the control gate structure. The device has a network of inherent capacitances, including an inherent capacitance of an undeflected nanotube switching element in relation to the gate structure. The network is such that the nanotube switching element is deflectable into contact with the other of the gate structure and the control gate structure in response to signals being applied to the control gate and one of the source region and drain region.

According to another aspect of the invention, the nanotube switching element is an article formed from a porous fabric of nanotubes.

According to another aspect of the invention, the fabric is substantially a monolayer of nanotubes.

According to another aspect of the invention, the nanotubes are single-walled carbon nanotubes.

According to another aspect of the invention, the source and drain regions are disposed on or in a horizontal substrate and the nanotube switching element is suspended horizontally in relation to the horizontal substrate.

According to another aspect of the invention, the source and drain regions are aimed as diffusions and one of the source and drain diffusions is a selection line for the device, and wherein the nanotube switching element is a second selection line for the device.

According to another aspect of the invention, the source and drain regions are disposed orthogonal to the nanotube element.

According to another aspect of the invention, the device has an area of about $4F^2$.

According to another aspect of the invention, the device includes a metallic layer disposed on the gate structure on a surface facing the nanotube switching element.

According to another aspect of the invention, the nanotube switching element is supported by supports having a known dielectric characteristic and wherein the geometry of the supports is of a tailored size to create a known inherent capacitance of an undeflected nanotube switching element in relation to the gate structure and wherein the known inherent capacitance of the undeflected nanotube switching element has a known ratio relationship to an inherent capacitance characterizing the gate structure in relation to the channel region.

According to another aspect of the invention, the ratio relationship is about 0.25.

According to another aspect of the invention, a release line is positioned in spaced relation to the nanotube switching element, and having a horizontal orientation that is parallel to the orientation of the source and drain diffusions.

According to another aspect of the invention, the device includes a metallic layer disposed on the release line on a surface facing the nanotube switching element.

According to another aspect of the invention, the contact between the nanotube switching element and the one of the control gate and gate structure is a non-volatile state.

According to another aspect of the invention, a crossbar array has n input lines and n output lines and $n^2$ non-volatile transistor devices, each device including a source region and a drain region of a first semiconductor type of material, a channel region of a second semiconductor type of material disposed between the source and drain region, a gate structure made of at least one of semiconductive or conductive material and disposed over an insulator over the channel region, a control gate made of at least one of semiconductive or conductive material, an electromechanically-deflectable nanotube switching element wherein the element is in fixed contact with one of the gate structure and the control gate structure and wherein the element is not in fixed contact with the other of the gate structure and the control gate structure; the nanotube switching element being deflectable into non-volatile contact with the other of the gate structure and the control gate structure in response to signals being applied to the control gate and one of the source region and drain region, and a release line positioned in spaced relation to the nanotube switching element. The crossbar also includes a switch line decoder providing n select lines, each select line coupled to one of the source and drain regions of each device of a corresponding set of devices, and a release line decoder providing n select lines, each release line coupled to a release line of each device of a corresponding set of devices.

BRIEF DESCRIPTION OF THE DRAWING

In the Drawing:

FIG. 3A is a cross section, conceptual schematic showing the structural location of the capacitance network in a certain regime;

FIG. 3B is a cross section, conceptual schematic showing the structural location of the capacitance network in another regime;

FIG. 9 shows intermediate structures used in building the NT support structure of FIGS. 7A & B;

DETAILED DESCRIPTION

The NT electromechanical switching components in the described embodiments incorporate a nanofabric component. More specifically, preferred embodiments provide transistor devices in which a nanotube switching element is integrated into a control element of the transistor, such as the gate of a FET device. (Nanotube switching elements are described in more detail in other applications and/or patents identified below, and are discussed herein to the extent relevant for understanding the preferred embodiments.)

Figure 1A:
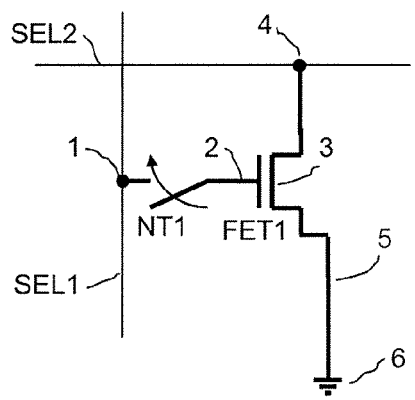
FIG. 1A is a nanotube (NT)-on-gate of FET schematic.

FIG. 1A illustrates a nanotube (NT)-on-gate of FET approach. This structure utilizes a nanofabric-based switch NT1 which controls the FET transistor gate which controls the transistor channel, and therefore the current through the transistor as shown. The gate voltage of FET1 is not defined; it floats. Therefore if a voltage is applied to node 1 using SEL1, the voltage across nanotube NT1 is not known.

Figure 1B:
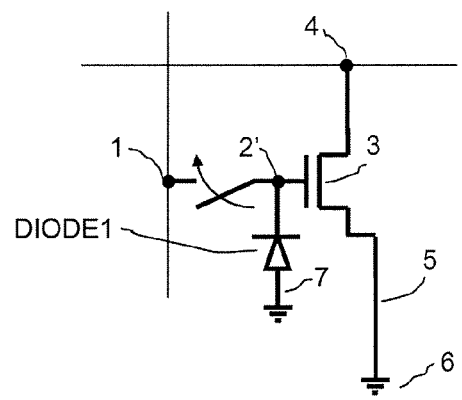
FIG. 1B is a nanotube (NT)-on-gate of FET schematic with a diode to discharge node.

FIG. 1B changes the arrangement by adding DIODE1 between substrate diffusion 7 and discharging node 2', allowing a leakage current to flow between diffusion 7 and discharging node 2'. Node 2' will be kept at 0 volts. In operation, sufficient voltage applied to node 1 using SEL1 will cause nanotube NT1 to switch. Because this cell requires an additional connection in relation to the cell shown in FIG. 1A, the cell of FIG. 1B is relatively large.

Figure 1C:
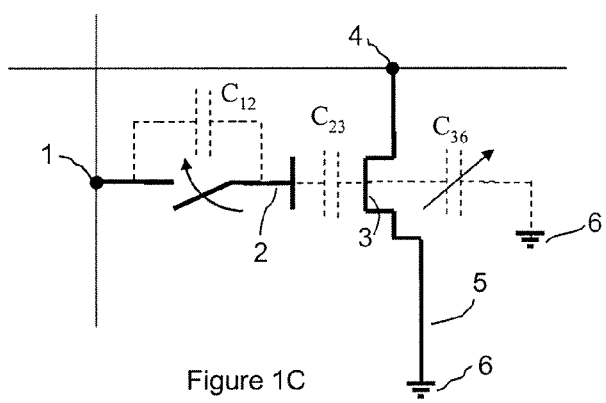
FIG. 1C shows a NT on gate structure and a corresponding capacitance network that can be modulated.

FIG. 1C illustrates a different cell that is smaller than that shown in FIG. 1B, and that may be operated as a memory cell or non-volatile transistor device. The cell is shown in a capacitance network that can be modulated in such a way that the voltage at node 2 is defined, and in such a way that NT1 will switch. The voltage at node 2 can be detected without the need for additional elements such as the diode of FIG. 1B.

More specifically, the device of FIG. 1C may be operated as follows. The voltage at node 2 is controlled by a combination of the voltages applied to node 1 and node 4. The voltage at node 1 is applied to the capacitance network and channel region 3 is inverted. If the voltage at node 4 is set to zero, then electrons remain in the channel region, and capacitor $C_{36}$ between the channel region and the semiconductor substrate is bypassed (not in the capacitor network). In such a case, node 2 voltage swing is minimized, which in turn maximizes the voltage difference between node 1 and node 2. If the difference in voltage between node1 and node 2 exceeds the nanotube electromechanical switching threshold voltage ($V_{NT-TH}$), then nanotube switch NT1 closes and a conductive path is formed between node 1 and node 2. If, however, the voltage at node 4 is not zero (1 to 3 volts, for example), then capacitors $C_{23}$ and $C_{36}$ are in series, the node 2 voltage swing is maximized, which in turn minimizes the voltage difference between node 1 and node 2. In such a case the nanotube electromechanical switching threshold voltage ($V_{NT-TH}$) is not exceeded, and switch NT1 does not switch, and remains in the open position. Note that during the switch setting operation, node 5 may be left floating (open), but should be grounded for the read operation. It should be noted that FIGS. 1A, 1B, and 1C show the arrow as only closing the NT1; these figures are thus depictive of one time programmable (OTP) devices; however, the invention itself and preferred embodiments described below include devices allowing multiple programming.

Figure 2:
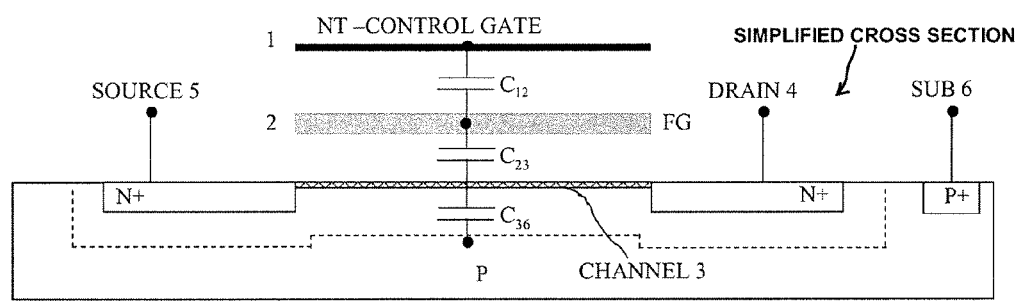
FIG. 2 is a cross section, conceptual schematic showing the structural location of the capacitance network of FIG. 1C.

FIG. 2 is a simplified cross section of the structural location of the capacitance network and nodes in the schematic of the FIG. 1C structure. A nanotube NT fabric element is used as the control gate 1 of the device and is capacitively coupled to a floating gate (FG) 2 by capacitor $C_{12}$. A NT fabric element is used as the word line in array configurations, and as a switch that contacts floating gate 2 when activated. Other materials may be used as the word line under other embodiments of the present invention. Gate FG is referred to herein as a floating gate, but in reality it only floats when the NT is in the "OFF" state. In the "ON" state, NT contacts FG 2 with an ohmic contact, and FG is no longer floating. When NT contacts FG, then capacitor $C_{12}$ is shorted out. The capacitor between FG node 2 and the FET channel 3 is $C_{23}$. Capacitor $C_{36}$ is also referred to as the depletion capacitor $C_{DEP}$. Capacitor C36 not part of the network when an inverted channel exists; capacitor C36 is part of the network when there is no inverted channel.

FIGS. 3A-B illustrate channel modulation using voltage $V_D$. During a write (program) operation, a channel region is formed by applying a control gate voltage that couples to the FG node by means of a capacitor network such that the transistor threshold voltage $V_{TH}$ is exceeded. The voltage of a diffusion (either diffusion) is modulated by applied voltage. For example, if $V_D=0$, electrons stay in the channel region, and the channel stays inverted. If $V_D$ is positive, e.g., between 1-3 volts, electrons are removed from the channel region which becomes depleted. The diffusion voltage modulates the capacitance network controlling the voltage on the floating gate FG (node 2 in FIGS. 1A & 1C).

Figure 4A:
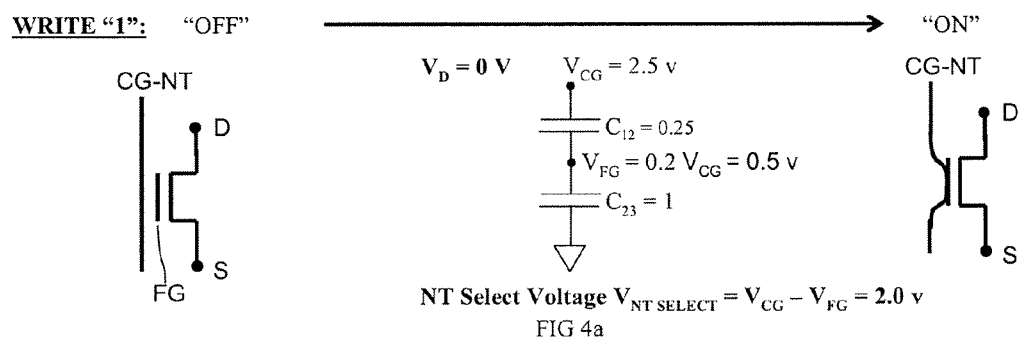
FIGS. 4A and 4B illustrate the write operations of the NT switch in the OFF mode and ON mode respectively.
Figure 4B:
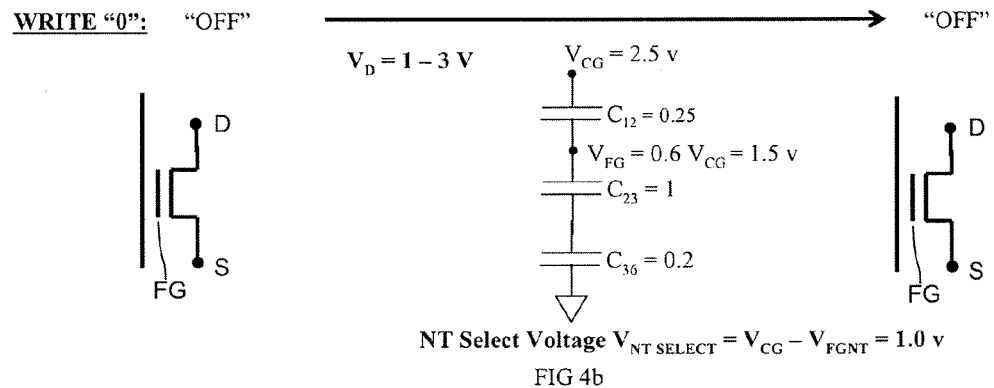

FIG. 4 illustrates the write operation of the NT switch. The nature in which the nanotube element may be caused to deflect from one state to the other and the manner in which such switches may be arranged and constructed are more fully described in incorporated references, identified below. However, for purposes of describing the preferred embodiments, one can envision an electromechanical switch. The NT begins in the "OFF" (open) state after fabrication and can make one "OFF"-to-"ON" transition for OTP embodiments. Alternatively, the NT switch may be switched to the "OFF" (open) state if released by a release node prior to write in the read, release/write mode of operation (discussed below). Exemplary relative capacitance ratios are shown in FIG. 4, and are as follow: $C_{12}=0.25$, $C_{23}=1$ and $C_{36}=0.2$.

Transistor gate capacitor $C_{23}$ is determined by the gate oxide thickness and dielectric constant (relative dielectric constant of gate oxide is typically 3.9), and the transistor geometries, width and length, for example, as described in Baker et. al., "CMOS Circuit Design, Layout, and Simulation", IEEE Press Series, 1998 pages 84 and 85. For this example, capacitor $C_{12}$ is designed to be equal to 0.25 $C_{23}$, by a choice of a control gate to FG overlap area, control gate to FG separation, and dielectric constant. When designing capacitor $C_{12}$, the coupling area (region) between NT and FG includes the NT support area and the gap switching area (region) as illustrated below. The NT support area dielectric constant depends on the choice of insulator support dielectric material. For example, polyimide has a relative dielectric constant of 2.5; silicon dioxide has relative dielectric constant of 3.9; and alumina has a relative dielectric constant of 9.5. The relative dielectric constant in the gap region is 1. The relative plate area of capacitor $C_{12}$ may also be controlled by the choice of NT fabric clamping material (insulator or conductor) above the nanotube fabric in the NT support region in the perimeter of the NT fabric suspended region. For example, a metallic support may be used instead of an insulating support, filling-in a controlled portion of the porous NT fabric over the NT support region to increase control gate to FG coupling area as needed. The depletion capacitance is typically 0.2 $C_{23}$. The NT switching (select) voltage, modulated by the capacitance network, results in a difference in voltage between NT and FG ranging from 1.0 and 2.0 volts. NT threshold voltage should be above 1.0 volts, and below 2.0 volts; 1.5 volts, for example. In the "ON" state, the NT control gate is in electrical contact with gate FG, and the transistor threshold voltage is low, 0.3 to 0.7 volts, for example. In the "OFF" state, the NT control gate is not in direct electrical contact with NT, and the control gate voltage is coupled to the NT gate through a capacitor voltage divider network. Because of the voltage reduction at transistor gate NT due to the capacitor voltage divider, the threshold voltage for control gate formation of a channel region between source and drain is increased to 1.2 to 1.5 volts, for example. The effective threshold voltage of the transistor has been increased to 1.2 to 1.5 volts.

The stored state may be detected by applying a control gate voltage that is higher than the transistor "ON" state threshold voltage 0.3 to 0.7 volts, and below the transistor "OFF" state effective threshold voltage of 1.2 to 1.5 volts. A control voltage of 1 volts will cause a corresponding precharged bit line voltage to discharge for an "ON" state, and to remain charged for an "OFF" state. A sense amplifier/latch may be used to detect the state of the cell. The cell may be written (programmed) once (OTP) and read an unlimited number of cycles.

Figure 5:
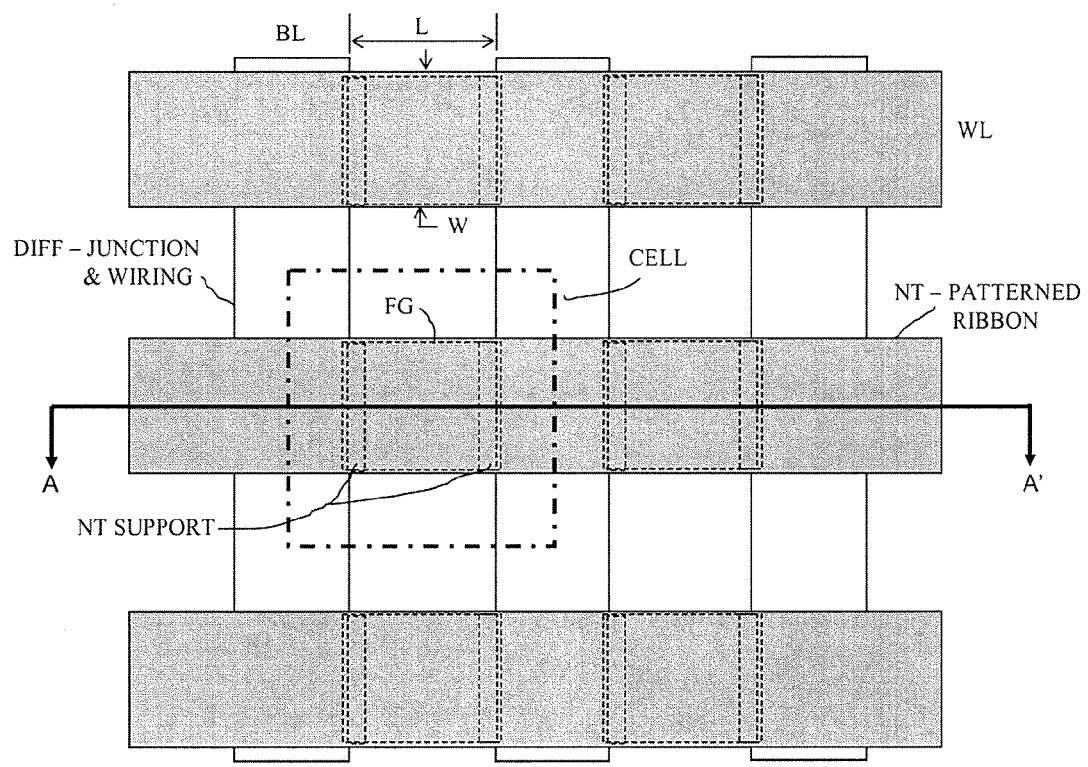
FIG. 5 shows the top view of a non-volatile array cell according to certain embodiments of the invention.

FIG. 5 is a plan view of a non-volatile array cell. The bit lines BL are diffusion, the word lines are patterned NT ribbons, orthogonal to the diffused lines. The patterned nanotube ribbons may be formed and patterned by any appropriate method, such methods are not described herein for the sake of brevity but are described in "Methods Of Making Carbon Nanotube Films, Layers, Fabrics, Ribbons, Elements And Articles," U.S. patent application Ser. No. 10/341,005, filed Jan. 13, 2003. The control gate is the NT in the region above the FG region. As stated above, the NT does not contact FG in the "OFF" state, and therefore the FG in this state is truly floating. Length L and width W of a transistor device may be minimum dimensions and defined by the FG. As shown, the cell size is $4F^2$; there are no array contacts requiring via holes between layers of the structure.

Figure 6A:
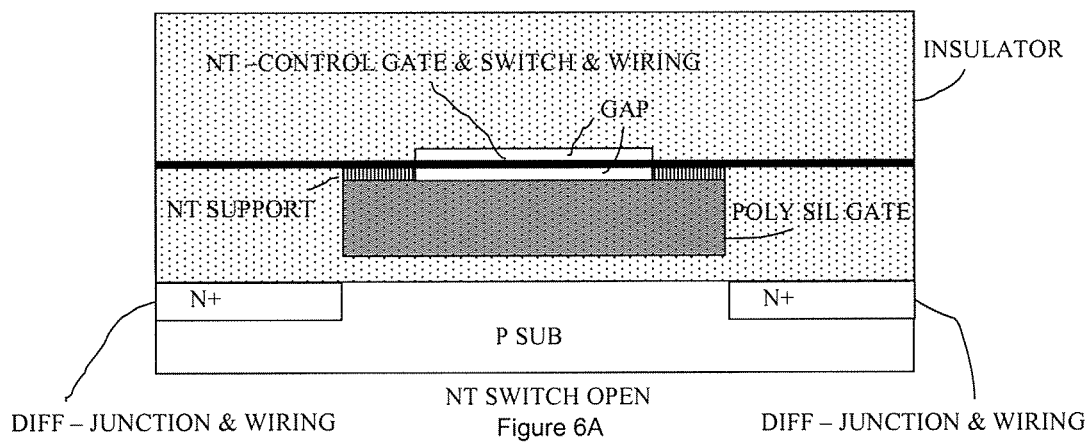
FIGS. 6A and 6B show cross sections of the cell of FIG. 5 in the OFF mode and ON mode respectively.
Figure 6B:
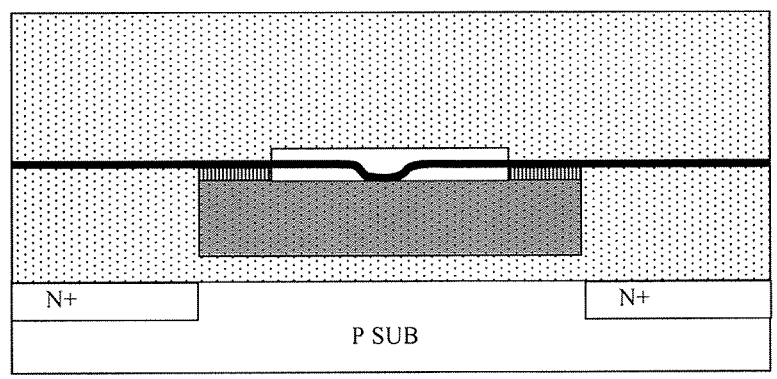

FIGS. 6A-B show cross-sections of the cell taken along line A-A' of FIG. 5 and with the device in different states. The cell cross-section is shown with NT supports applied directly to the polysilicon gate. A release gap is shown between polysilicon gate and the NT film. Another release gap is above the film.

FIG. 6A shows a cell in the "OFF" (open) state, i.e., the initial state of the cells in the OTP memory. FIG. 6B shows the "ON" (closed or switched) state for selected bits.

FIG. 7 shows a cross section of a cell like the cell shown in FIG. 5 only having a metallic layer between the polysilicon gate and the NT control gate. The metal layer changes the electrode material and therefore it may be used in different applications and may by treated differently. Polysilicon can have asperities (spikes) on the top surface that can locally concentrate an electric field. Any potential asperities are covered by the metal layer. During metal layer formation, the metal layer electrode surface can be planarized using well known techniques such as chemical mechanical polishing (CMP) or reactive ion etch (RIE). Like the cells shown in FIGS. 5 and 6, the cell as shown in FIG. 7 also has no contacts between layers. As shown, this cell operates in OTP mode.

Figure 8A:
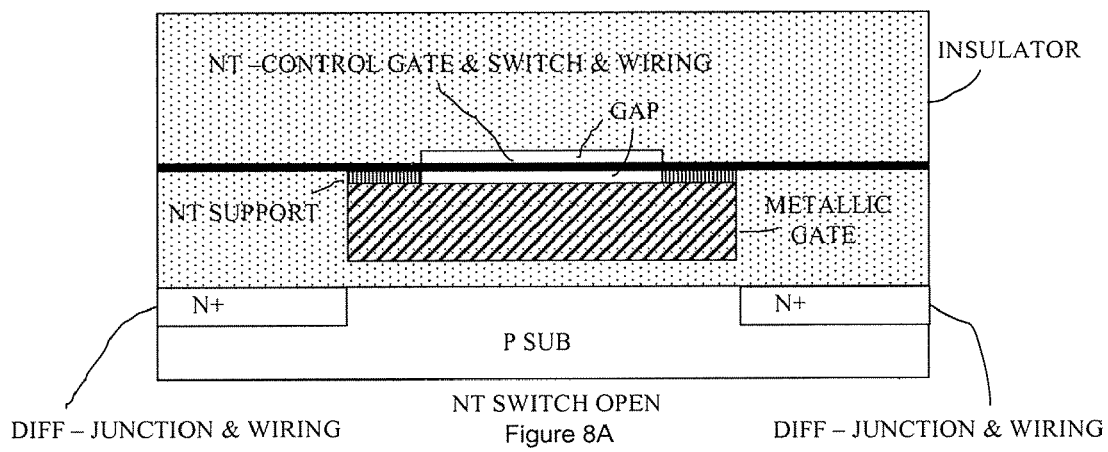
FIGS. 8A and 8B show cross sections of FIG. 5 that illustrate vertical structures in which the FG is metallic line in the OFF mode and ON mode respectively.
Figure 8B:
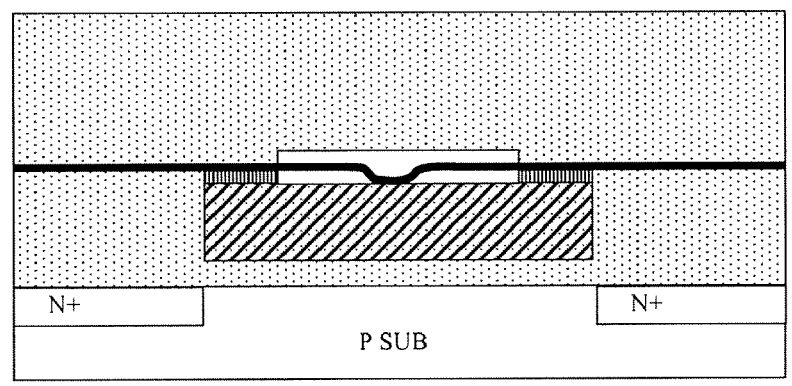
Figure 9A:
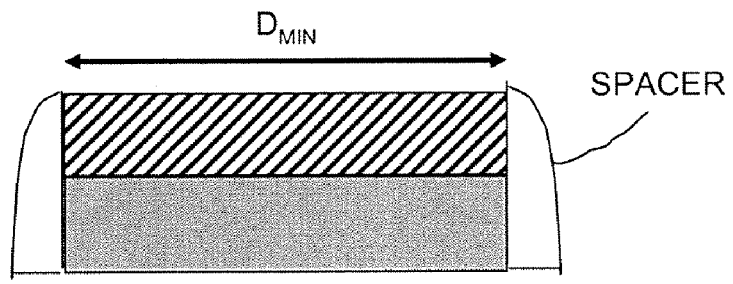
FIG. 9A is the starting structure.
Figure 9B:
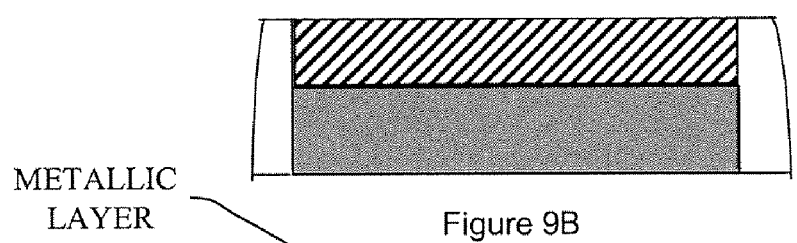
FIG. 9B shows the structure after planarization by CMP or other means.
Figure 9C:
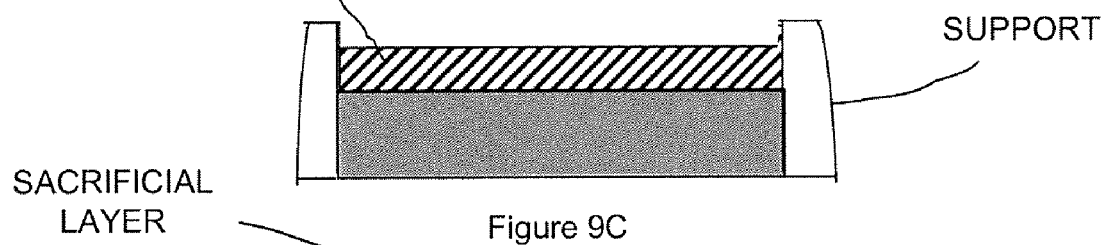
FIG. 9C shows the metallic layer after being etched back.
Figure 9D:
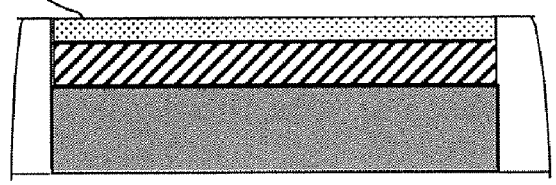
FIG. 9D shows the structure after a sacrificial layer has been deposited and planarized prior to the deposition of the NT ribbon.

FIG. 8 illustrates yet another embodiment of an OTP device according to certain embodiments of the present invention. This cell is like the cell shown in FIG. 5 but this cell has a FG that is metallic. As before, there are no contacts between layers.

Figure 7A:
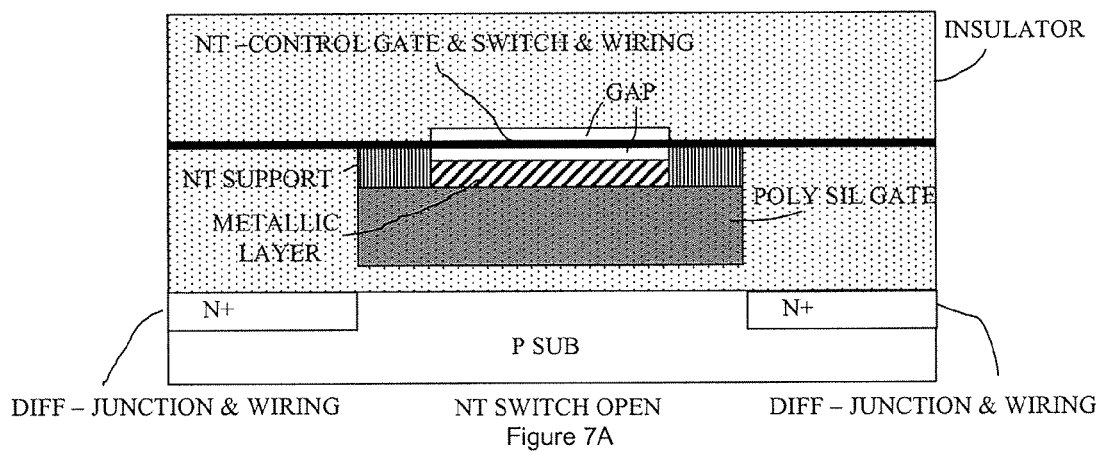
FIGS. 7A and 7B show cross sections of FIG. 5 with a metallic layer between the polysilicon gate and the NT control gate in the OFF mode and ON mode respectively.

FIG. 9 shows intermediate structures used in building the NT support structure of FIGS. 7A & B. A goal that is achieved using this method is self alignment of the NT support structures using a sidewall spacer applied to the minimum dimensions $D_{MIN}$ (FET channel length direction) prior to implantation of the self aligned source and drain regions of the FET. FIG. 9A is the starting structure having side spacers, a metallic layer over a sublayer. The structure is planarized by CMP or other appropriate means, creating the intermediate structure shown in FIG. 9B. The metallic layer is etched back creating the intermediate structure shown in FIG. 9C. A sacrificial layer is deposited and planarized (FIG. 9D) prior to the deposition of the NT ribbon. The NT fabric layer support illustrated in FIG. 9D is one example of a support structure adjacent to the sides of the NT gate. NT layer pinning structures are placed over the top and side-wall of the nanotube fabric overlapping the support structure of FIG. 9D. FIGS. 6 and 7 illustrate NT fabric support structure examples in which the NT fabric layer support is defined on the top layer of the FG structure. The sacrificial layer is removed later in the process. (Creation of such suspended nanotube fabric switches is described in incorporated references as stated above.)

Figure 7B:
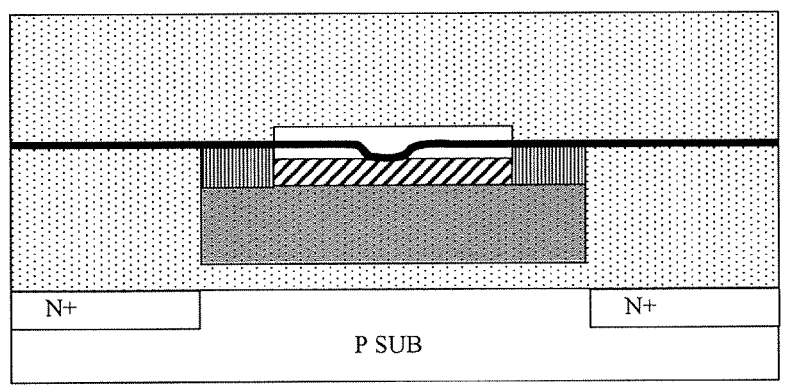

The foregoing process sequence can also used in the fabrication of the structure shown in FIGS. 7A and 7B. The sidewall process approach integrates a support structure self aligned to the polysilicon gate structure, and it can be used to achieve a $4F^2$ cell area.

Exemplary One-Time-Programmable cell as described and shown in FIGS. 5, 6, 7, 8, and 9 are very dense. The use of diffused bit lines will mean it is relatively slow in operation; however the use of salicided diffusions will reduce diffusion resistance.

Figure 10:
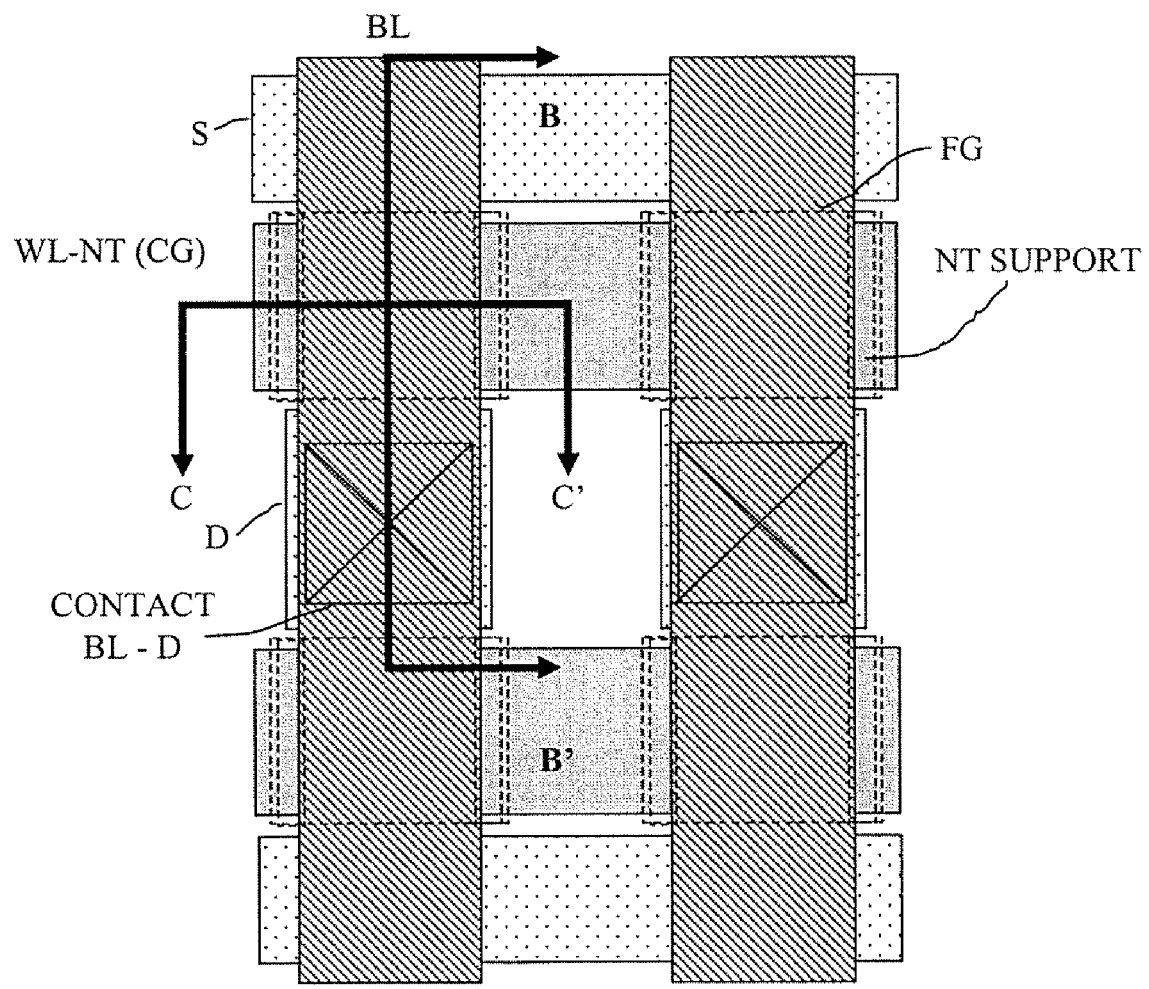
FIG. 10 illustrates a top view of a higher performance One Time Programmable (OTP) cell.

FIG. 10 illustrates a plan view of an OTP cell having higher performance than those described above. In the illustrated structure, metallic bit lines are used for cell selection in order to improve memory array performance. Metallic bit lines contact the drains of the FET devices. Source diffusions are common and may be stitched periodically in the array structure for higher array performance. Likewise, NT fabric array wiring may also be stitched periodically in the array structure to enhance array performance. ("Stitching" is a technique known in the art.) In one example of stitching, a conductor such as aluminum is patterned above a polysilicon word line. Via holes are provided at regular intervals interconnecting the conductor and polysilicon word line to reduce polysilicon word line resistance, which enhances the performance of DRAM, SRAM and other array structures. Because this structure uses contacts between layers, this cell requires additional room and the cell is larger than $4F^2$. The layout of the cell changes the orientation of the NT support structures relative to the orientation in FIG. 5. The supports in this structure are along the width direction of the FET device and are shown in FIG. 10. Although the NT fabric structures of FIGS. 5 and 10 are shown supported on two sides, the NT fabric structure may be supported on all four sides. As shown, the word lines are orthogonal to the bit lines. Such word lines may be formed from patterned nanotube-based fabrics.

Figure 11:
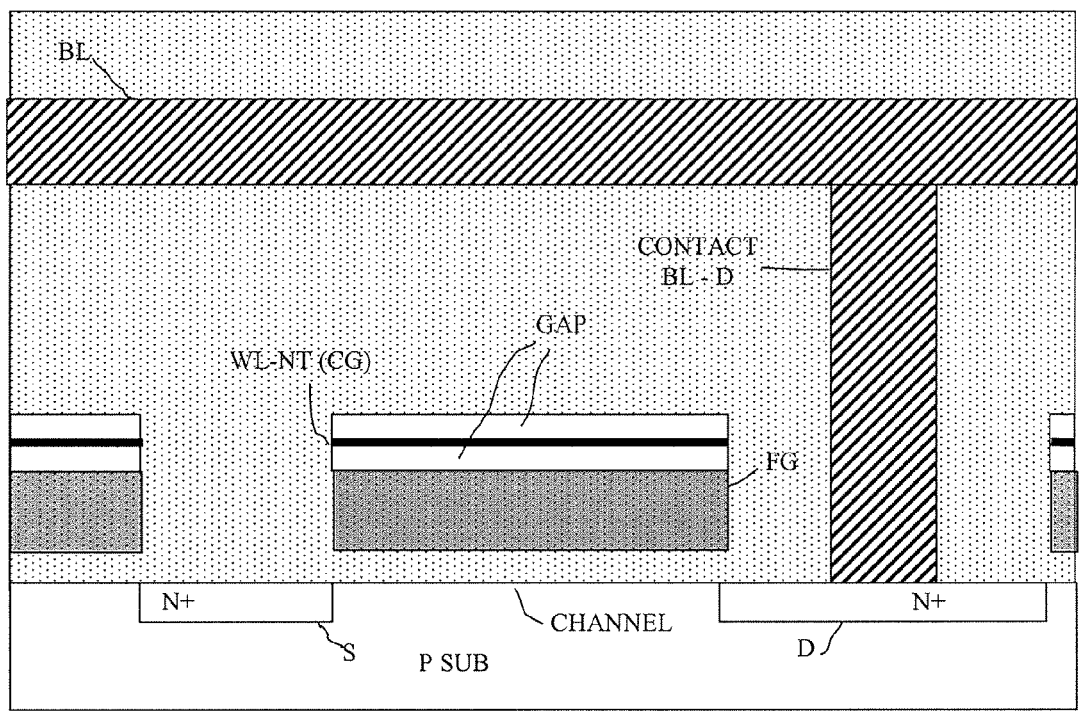
FIG. 11 illustrates a cross section of FIG. 10.

FIG. 11 illustrates a cross section of FIG. 10 taken along the metal bit line B-B' of FIG. 10. Bit line contact to drain diffusion is shown. Also in this figure is a cross section of the NT word line. The NT film is the control gate of the FET structure. In a preferred embodiment of the present invention, the structure is single poly; however other appropriate material may be used. The cell is shown in the "OFF" (open) state. The channel region and diffusions of the device are shown.

Figure 12:
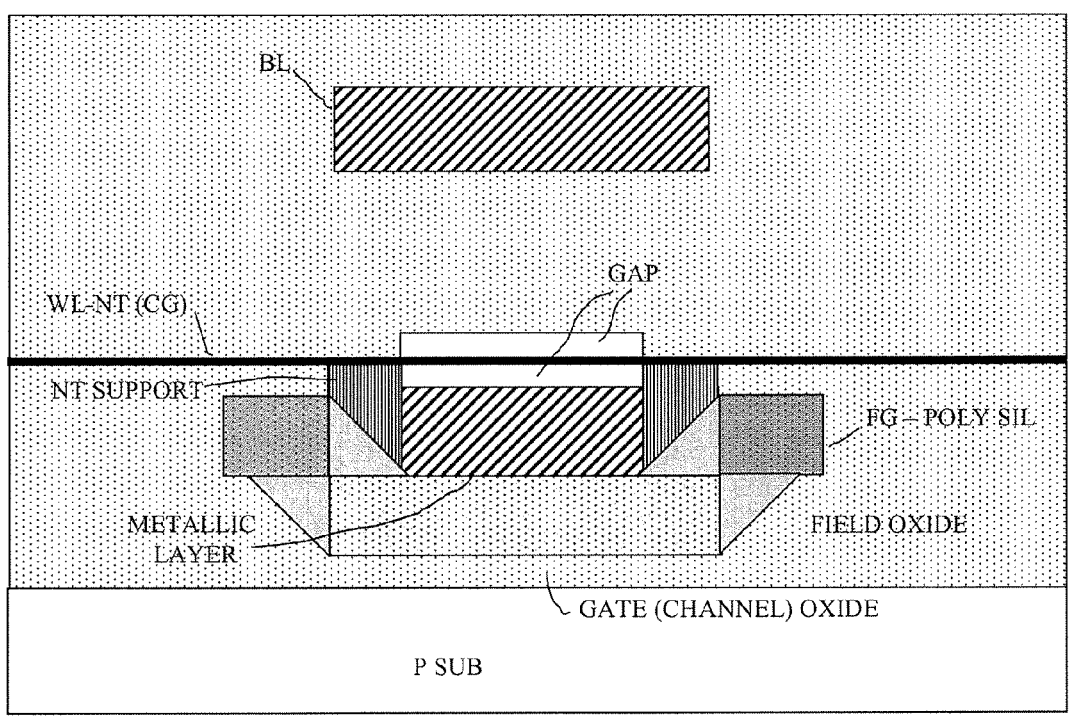
FIG. 12 is a cross section of FIG. 10 along the NT word line.

FIG. 12 illustrates a cross section of FIG. 10 along the NT word line C-C' of FIG. 10. This illustration shows polysilicon FG along the width region of the FET device. The FG structure is situated over thin gate oxide in the channel region and the FG structure also overlays a thick field oxide region causing a step in the oxide layer. If used, a shallow trench isolation structure (not shown) can minimize the polysilicon step height.

The cross section shown in FIG. 12 illustrates how the cross section illustrated in FIGS. 7A and B can be planarized using the metallic layer/NT support films to form a controlled gap between NT film and metallic layer on the polysilicon gate.

The cross section illustrated in FIG. 12 further shows the NT film as an array wire (word line), and the control gate of the FET, and as a switch that can close and electrically connect NT with the metallic layer on the polysilicon gate.

Figure 13:
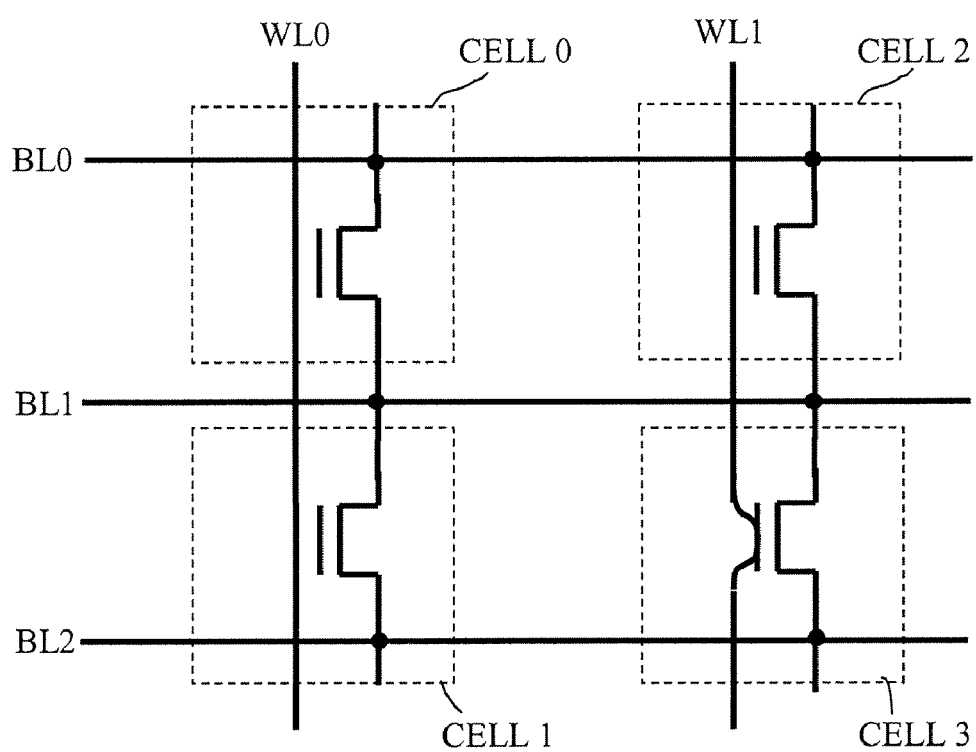
FIG. 13 illustrates four bits of an OTP array.

FIG. 13 illustrates a schematic representation of four bits of an OTP array. A corresponding array layout may use cells as illustrated in FIG. 5 or FIG. 10. Cells 0, 1, and 2 are shown in the "OFF" (open) state. And as stated earlier, all cells of an OTP memory product are open at fabrication. In this figure, cell 3 is shown with the NT switched to the "ON" position. This bit has been programmed once; as an OTP cell, it cannot be reprogrammed.

Figure 14:
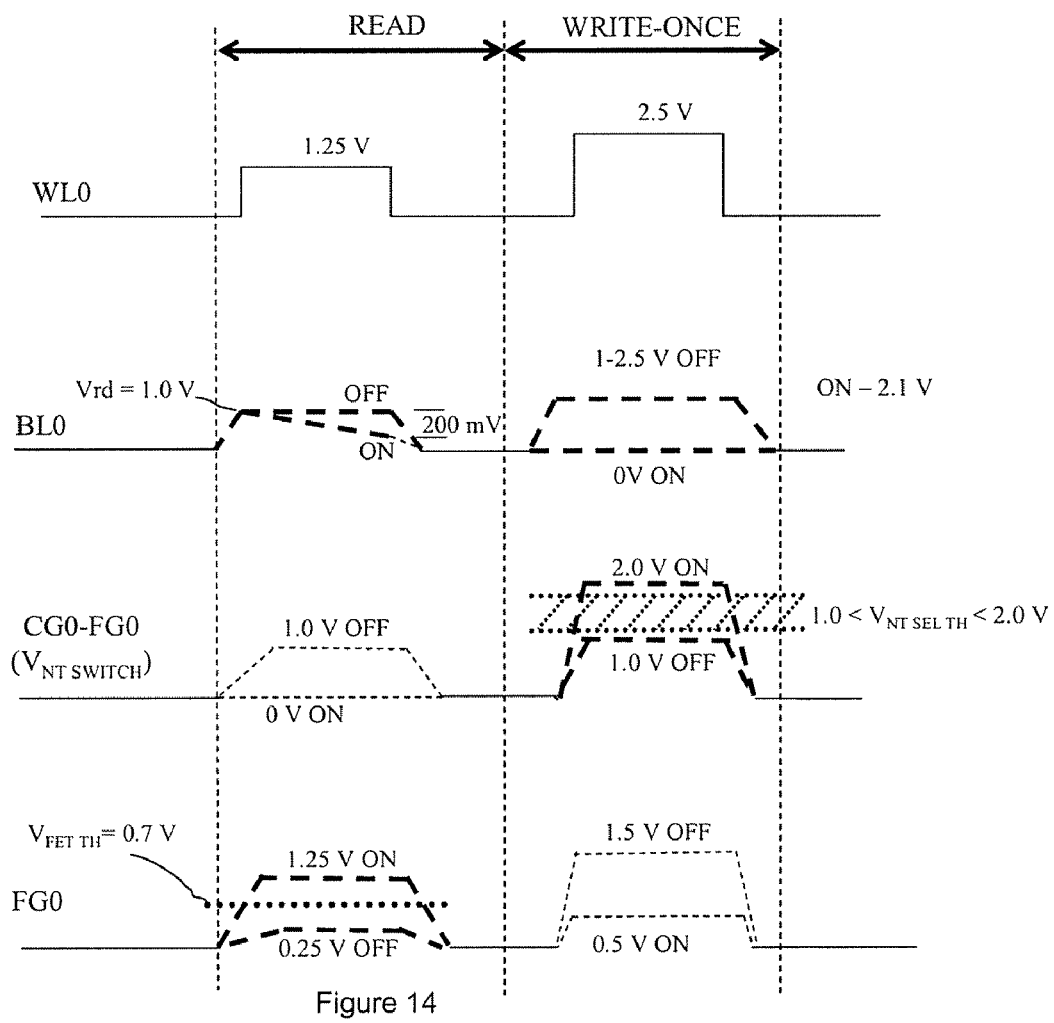
FIG. 14 illustrates the timings of the read and write-once operation.

FIG. 14 illustrates the timing and waveforms of the various lines to perform read and write-once operations. When reading the state of the device, a voltage of 1.25 volts is applied to the WL0, which is an NT ribbon; BL0 is driven high, e.g., 1 volt, and released. If the device is in the "ON" state, then WL0 (the NT0 control gate CG0) is in ohmic contact with floating gate FG0; FG0 is at 1.25 volts and turns on the FET that has a threshold voltage of 0.7 volts, for example; and BL0 is discharged.

For a device in the "OFF" state, the FG0 is capacitively coupled to NT, and the FG0 voltage is 0.25 volts; the FET remains "OFF" and BL0 is not discharged. During read, adjacent cell disturb is avoided because the voltage between the NT and the electrode (voltage between CG0-FG0) is no greater than 1 volt, and therefore cannot perform an unintended write operation.

When writing-once, 2.5 volts is applied to the WL0 (nanotube ribbon). If BL0 is at 0V, then 2 volts appears between NT and electrode (between CG0-FG0) and the device goes from "OFF" to "ON". If BL0 is at a positive voltage (1 to 2.5 volts, for example), then the voltage between CG0 and FG0 is 1 volt and does not switch the NT. Voltage control is as explained in reference to FIGS. 4A and 4B, above.

Figure 15A:
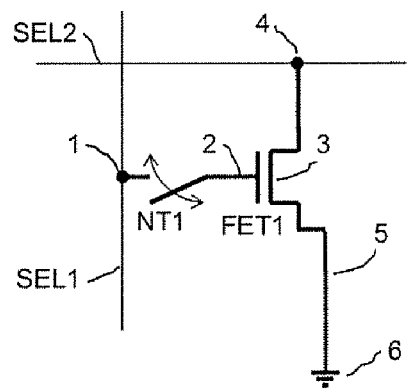
FIGS. 15A, 15B and 15C illustrate the Nanotube-on-Gate FET structures identical to 1A, 1B and 1C respectively in read, release/write mode.
Figure 15B:
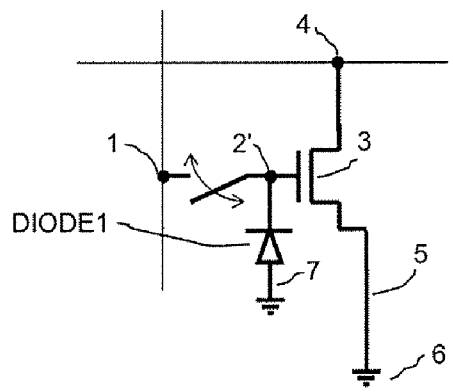
Figure 15C:
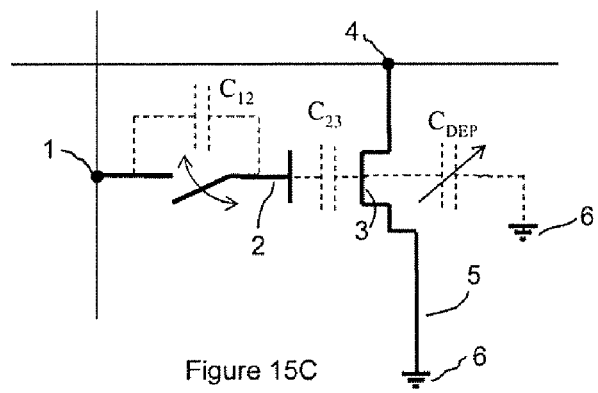

FIGS. 15A-C illustrate the Nanotube-on-Gate FET structure in read, release/write mode. This structure (including the capacitance network) is a device analogous to the one shown in FIG. 1, except the arrow indicates switching from "OFF" to "ON" and "ON" to "OFF." The cells described below have a release gate added to the NT structures. This allows the device to be rewritten multiple times.

Figure 16:
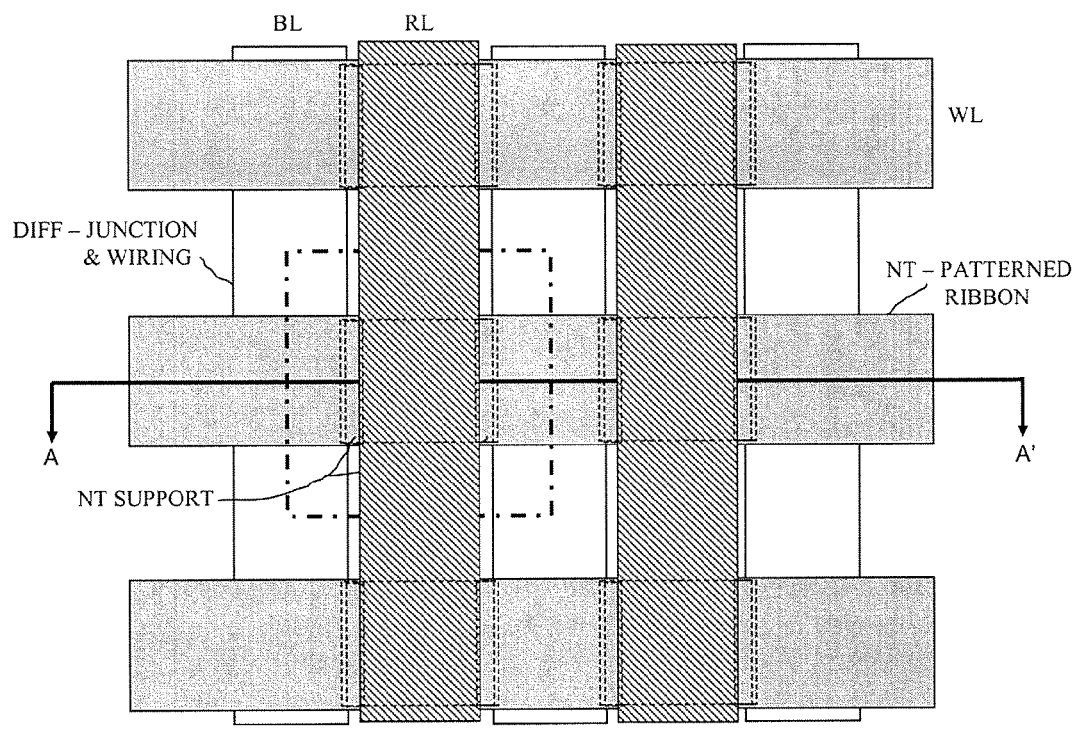
FIG. 16 shows FIG. 5 with a release line RL added above and orthogonal to the NT patterned ribbon.

FIG. 16 illustrates a structure like the one shown in FIG. 5 with a release line RL added above and orthogonal to the NT patterned ribbon. The cell illustrated in FIG. 16 is a read, release/write cell. RL is shown as aligned over the portion of the NT film suspended between the NT supports. Even allowing for some misalignment of RL relative to the suspended NT region between NT supports, the cell is a read/write cell of minimum cell area $4F^2$.

Figure 17A:
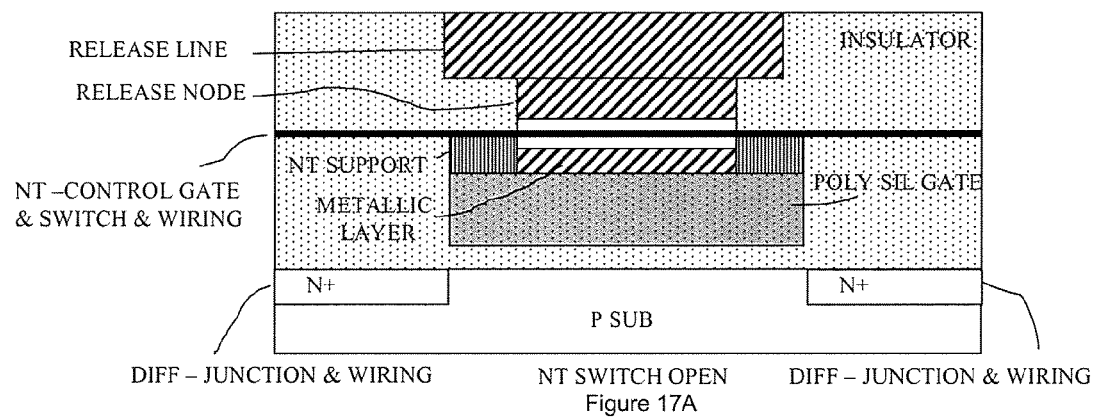
FIGS. 17A and 17B illustrate cross sections of FIG. 16 along the nanotube word line in the OFF mode and ON mode respectively.
Figure 17B:
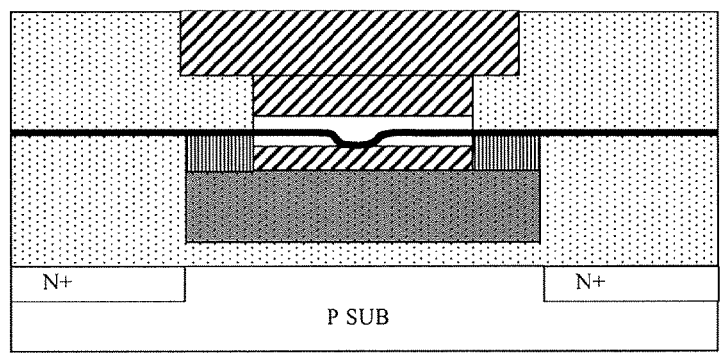

FIGS. 17A-B illustrate a cross section of the structure shown in FIG. 16 along the nanotube word line A-A' of FIG. 16. FIG. 17A shows the cell in the "OFF" mode and FIG. 17B shows the cell in the "ON" mode. The cross section shows a release node (or release electrode) above the release gap above the NT film. Even allowing for some misalignment of the release node relative to the NT suspended region, the cell area is a read/write cell of minimum cell area $4F^2$. In this case, the release line contacts the release node and alignment is not critical.

Figure 18:
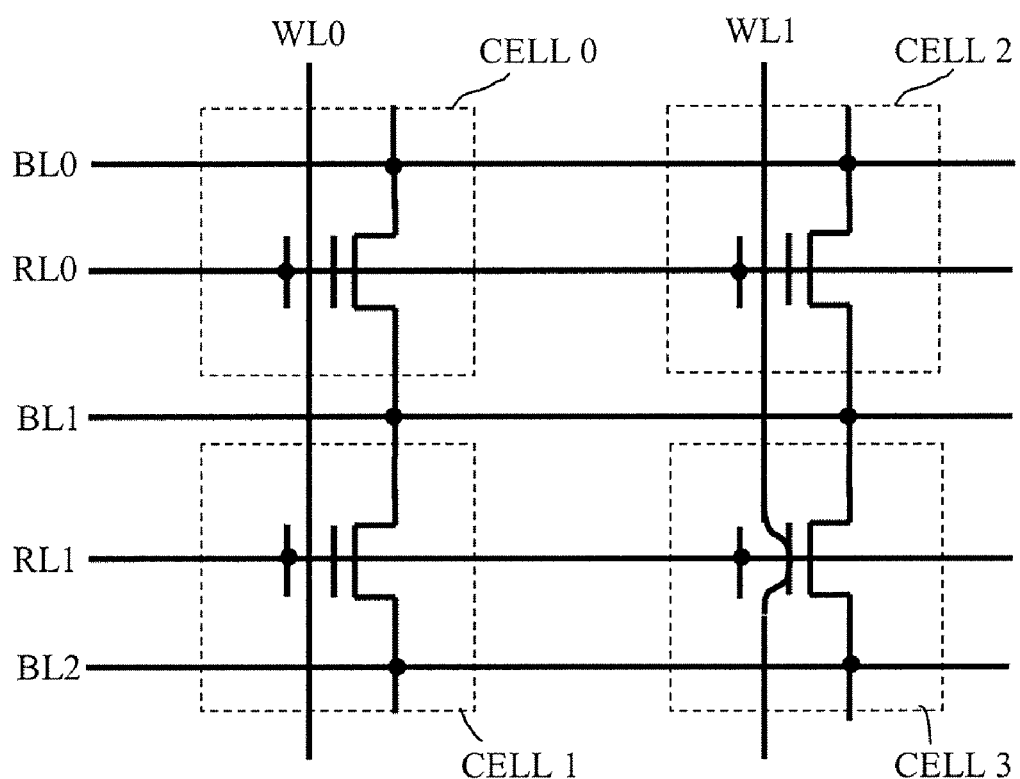
FIG. 18 is a schematic of four cells of an array foil red using the cell described in FIGS. 16, and 17A & B.

FIG. 18 is a schematic of four cells of an array formed using the NT-on-Gate cell described in FIGS. 16, and 17A and B. The memory array shown in FIG. 18 is similar to the memory array of FIG. 13, except that a release node (electrode) coupled to a release line RL0 has been added. The memory array of FIG. 18 supports read, release/write mode operation, and stores the information in a non-volatile state, which means the information remains unchanged when power is turned off. Such an array may be referred to as a nanotube random access memory (NRAM) array. Cells 0, 1, and 2 are illustrated in the "OFF" state, and cell 3 is illustrated in the "ON" state. Unlike the OTP cells described above, any cell can be turned (written/programmed) to the "ON" state, and be returned to the "OFF" state.

Figure 19:
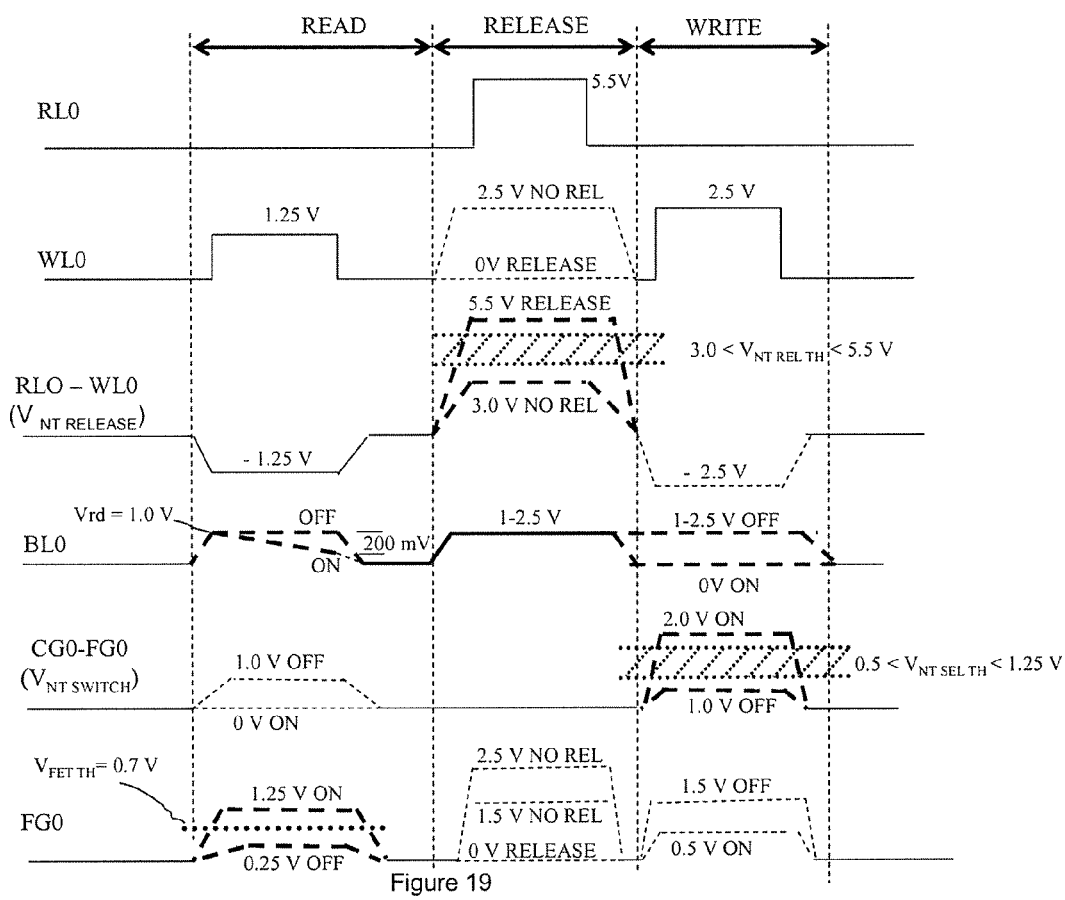
FIG. 19 illustrates the timing diagram of the memory array in FIG. 18.

FIG. 19 illustrates the timing diagram and waveforms of the memory array in FIG. 18. Read and write operation was illustrated in FIG. 14 for the OTP array shown in FIG. 13, and such operation is the same for the array shown in FIG. 18. Release RL0 timing is introduced with a release voltage pulse of 5.5 volts. Higher voltage may require some special layout and/or junction considerations for peripheral array drivers; however, ideally, no junction changes are needed.

Under some embodiments of the present invention, triple-diffused junctions can be used analogously to their current use in high voltage circuits. Ideally, guard ring or other layout modifications may accommodate higher voltages if required in the peripheral driver region.

As shown, the RL0 lines are orthogonal to the nanotube ribbon word lines WL0; however other layouts are possible. This specific layout accommodates single bit release, (byte release is described in U.S. Provisional Patent Application No. 60/459,222). The word line voltage is at zero for devices to be released. It is increased to 2.5 volts to avoid writing (disturbing) an adjacent bit. The release voltage is the difference in voltage between RL0 and WL0 (RL0-WL0). For bit release level selectivity, release voltage needs to be above 3.0 volts and less than 5.5 volts for release operation as illustrated. (Other specific voltages are within the scope of the present invention; one skilled in the art will understand that the voltages given are merely exemplary). For byte release (8 bits simultaneously) or block release (typically greater than 8 bits such as 256, 512, 1024, or all bits simultaneously released), then release voltage is any voltage between 0 and 5.5 volts. Bit or block release arrays, typically include bit level read & write.

An alternative programming approach to the approach described in FIG. 19, is to set all array bit lines (BL0, BL1, and BL2 in FIG. 18) to zero volts. Then activate array word lines (WL0 and WL1 in FIG. 18) to 2.5 volts, for example, and set all release line voltages to equal the word line voltage (such that the word line to release line electrostatic forces are zero), all bits are programmed to the "ON" state. Bits in "OFF" state switch to the "ON" state, and bits in the "ON" state remain in the "ON" state. Next, when selectively switching from the "ON" to the "OFF" state, all bit line voltages may be set at 1 to 3 volts, for example, to minimize the risk of switching unselected bits from the "ON" to "OFF" state. CELL 0 may then be selectively programmed to the "OFF" state by setting word line WL0 to zero volts, and release line RL0 to release voltage to 5.5 volts, for example. To avoid disturbing other array cells, word line voltage is increased to 3 volts, for example, for unselected bit locations. This operating mode is referred to as a partial select or half-select mode. For RL0 set at 5.5 volts, and word line WL1 set at 3 volts, CELL 2 remains in the "ON" state. For WL0 at zero volts, and RL1 at 3 volts, CELL 1 remains in the "ON" state and for WL1 at 3 volts and RL1 at 3 volts, CELL 3 remains in the "ON" state. The illustrative example assumes the same NT threshold voltages as illustrated in FIG. 18, and the capacitance network model described with respect to FIGS. 2, 3, and 4.

Figure 20:
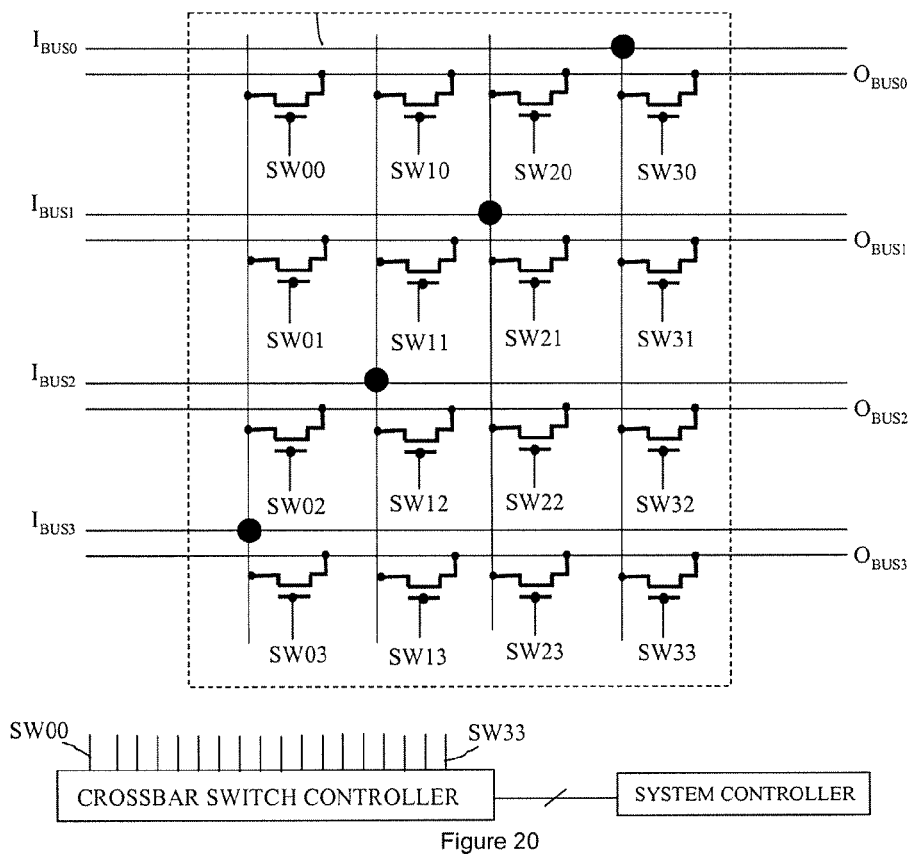
FIG. 20 is an illustration of a conventional (prior art) crossbar switch.

FIG. 20 illustrates a prior art, conventional 4-by-4 crossbar switch, having 16 switches, as described in Mead et. al., "Introduction to VLSI Systems", Addison-Wesley Publishing Company, 1980, pages 157 and 158. The basic topology of a crossbar switch dictates that any input bus bit (for example, a bit from bus line $I_{BUS1}$) must be available at any output bus position ($O_{BUS2}$, for example). Therefore, data paths must run at right angles to the normal bus data flow, as illustrated in FIG. 20. Note that information flow in the crossbar switch is bidirectional, so that input and output are interchangeable. For two buses, each n bits wide, the crossbar switch requires $n^2$ connections, one to each gate of the FETs illustrated in FIG. 20. For the n=4 bus illustrated in FIG. 20, 16 bits are required, with 16 lines from the crossbar switch controller (decoder), one output to each of the FET switches SW00 to SW33. As bus width grows, the crossbar switch of FIG. 20 becomes impractical to wire. For example, a 32 bit bus requires 1024 unique connections between crossbar switch controller and individual array switches. The FET switches of FIG. 20 are conventional FETs used in a pass gate configuration.

Carbon non-volatile nanotube switches use a NT-on-Gate device structure, and may also be used as pass gates; however, the state of the switch ("ON" or "OFF") may be retained when power is turned off (or lost). Also, very significantly, NT switches may be decoded at each switch location. Therefore, each gate is set at the intersection of a switch (select) line and release line, and there are n+n (2n) array lines required to activate each location. For a 32 bit wide bus (n=32), the crossbar decoders require 64 control lines, and not 1024 lines as required for the conventional controller of FIG. 20. The FET sources and drains are interconnected by wires that may be used for programming the array switches, and also transmit signals between bus lines.

Figure 21:
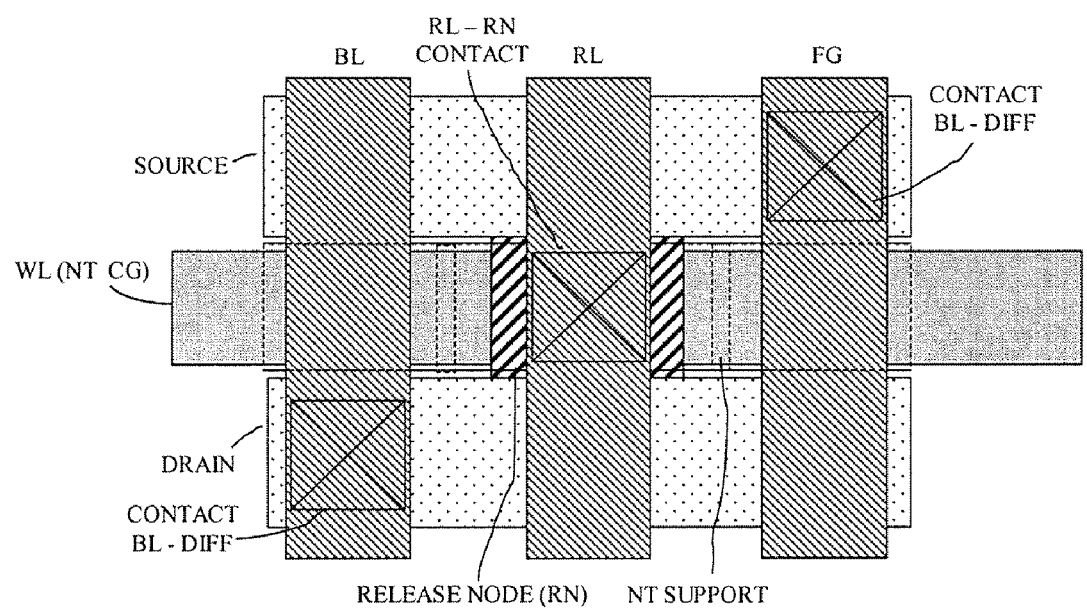
FIG. 21 illustrates the top view of a high performance NT-on-Gate FET device.

FIG. 21 illustrates a plan view of a high performance NT-on-Gate FET device, designed as a logic switch, that forms the basis of a nanotube crossbar switch. The W/L ratio is typically in the 5:1 to 50:1 range. Advantages of this structure include high switching speed and low channel-on resistance. The presence of metallic terminals at the drain and source terminals of the wide device allow it to handle relatively large currents. The NT-on-Gate device includes the NT ribbon that also acts as FET control gate. The patterned NT fabric may be used as the word line array wiring as well as an electrostatic switching device. When used as array wiring, the NT fabric layer may be stitched (as is commonly done in the industry with polysilicon word lines, for example) with a conductor such as aluminum or copper for higher performance. The exemplary materials for construction of this device take advantage of single polysilicon technology. However, FET technologies with metal gates may also be used. As shown, the NT is suspended over the polysilicon gate electrode (metal gate electrode transistors may also be used). As drawn, the NT supports are along the width direction of the device (supports are shown in broken lines), although NT fabric supports may be used on all sides of the suspended NT fabric region. Since a wide device is used for performance reasons, relative switch spacing is non-critical. The release node RN (or release electrode) is situated above the NT ribbon, separated by a gap. The release line RL contacts RN, alignment, however is non-critical. Key device operational leverage is derived by the orthogonal intersection of the release line RL and the NT switch (select) line SL, and the capacitor network described with respect to FIGS. 2, 3, and 4, that enable crossbar switch decoder to set the state of each non-volatile nanotube switch using 2n array lines in lieu of $n^2$ array lines as required for conventional FET switch implementations.

Figure 22:
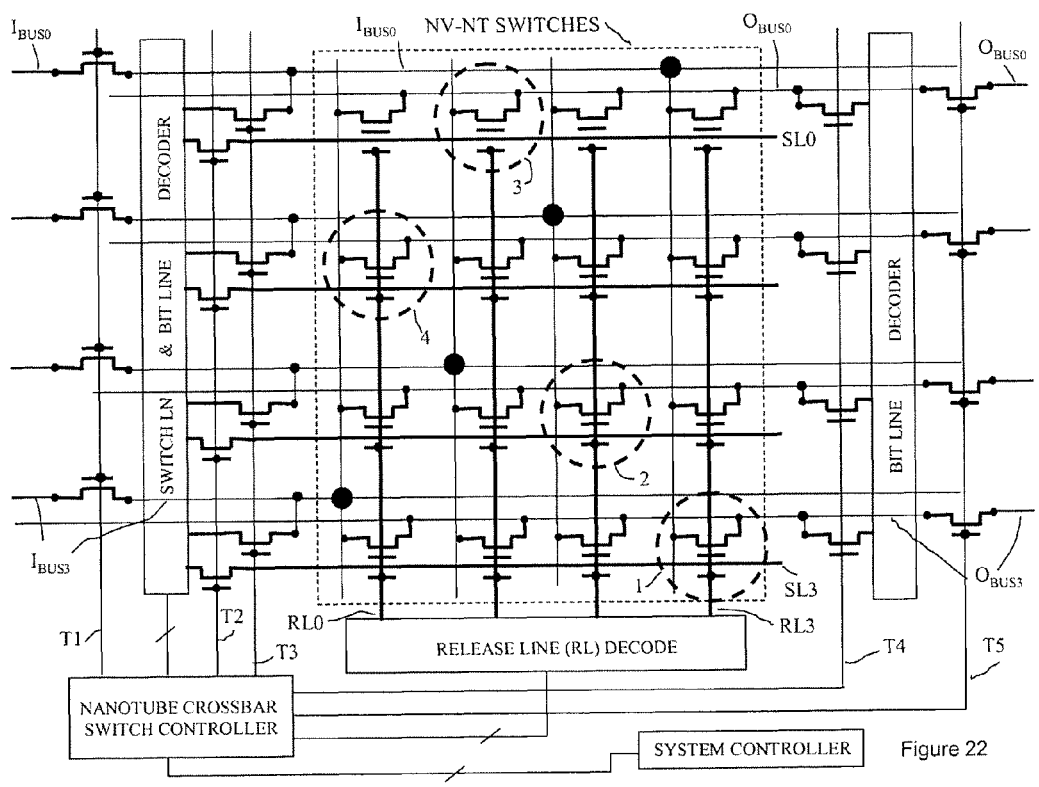
FIG. 22 illustrates a 4×4 crossbar switch using NT-on-Gate FET switches.

FIG. 22 illustrates a nanotube crossbar switch with an array of 16 non-volatile nanotube switches, and associated controllers, decoders, bus interrupt devices, and buses. Crossbar switches interrupt bus interconnections long enough to change the interconnections by re-programming the "ON"/"OFF" state of the switches. The nanotube crossbar switch uses the interrupt time to reset the array switches using a release line (RL) decoder, a combined switch line (SL) and bit line decoder, and mode setting transistors in series with the bus lines.

In operation, the NT switches are set/reset as follows. Bus interconnection is interrupted, and all bus line voltages in the NT switch array are set to zero volts. Then activate all switch lines (SL0-SL3 in FIG. 22) to switching voltage 2.5 volts, for example, and set all release line voltages (RL0-RL3) to equal the switch line voltage (such that the switch line to release line electrostatic forces are zero)—all NT switches are programmed to the "ON" state. NT switches in "OFF" state switch to the "ON" state, and NT switches in the "ON" state remain in the "ON" state. Next, when selectively switching from the "ON" to the "OFF" state, all bus line voltages in the NT switch array may be set at 1 to 3 volts, for example, to minimize the risk of switching unselected NT switches from the "ON" to "OFF" state. In this example, NT switches 1, 2, 3, and 4 remain in the "ON" position. The other 12 NT switches in the nanotube crossbar switch in FIG. 22 are selectively switched from the "ON" state to the "OFF" state. By way of example, the NT switch at the intersection of SL3 and RL2, adjacent to NT switch 1, is switched to "OFF" state as follows. Switch line SL3 is set to zero volts, and release line RL2 to release voltage to 5.5 volts, for example, releasing the NT switch to the "OFF" state. To avoid disturbing other array NT switches sharing release line RL2, the voltage on select lines SL0, SL1, and SL2 s are increased to 3 volts, for example, for unselected NT switch locations. This operating mode is often referred to as a partial select or half-select mode. For RL3 set at 5.5 volts, and select lines SL0-SL2 set at 3 volts, all other NT switches remain in the "ON" state. Release lines RL0, RL1, and RL3 are set at 3 volts, and all unselected NT switches remain undisturbed in the "ON" state. This half-select NT switch method is applied in turn, as illustrated, to all NT switches, except switches 1, 2, 3, and 4 that remain in the "ON" state. The illustrative example assumes the NT switches having the same threshold voltages as illustrated in FIG. 18, and the capacitance network model described with respect to FIGS. 2, 3, and 4. After all nanotube switches are programmed, switch line SL3 is only in electrical contact with FG at NT switch 1; switch line SL2 is only in electrical contact with FG of NT switch 2; switch line SL1 is only in electrical contact with FG of NT switch 4; and switch line SL0 is only in electrical contact with FG of NT switch 3 of FIG. 22. Next, SL3 is set to 1.0 to 1.5, for example, and NT switch 1 forms a conductive channel between transistor source and drain, in order to electrically connect $I_{BUS0}$ and $O_{BUS3}$; SL2 is set to 1.0 to 1.5, for example, and NT switch 2 forms a conductive channel between transistor source and drain, in order to electrically connect $I_{BUS1}$ and $O_{BUS2}$; SL1 is set to 1.0 to 1.5, for example, and NT switch 4 forms a conductive channel between transistor source and drain, in order to electrically connect $I_{BUS3}$ and $O_{BUS1}$; SL0 is set to 1.0 to 1.5, for example, and NT switch 3 forms a conductive channel between transistor source and drain, in order to electrically connect $I_{BUS2}$ and $O_{BUS0}$. For all other NT switches, switch line SL is coupled to FG by a capacitor voltage divider network, and for SL voltages of 1.0 to 1.5 volts, for example, no conductive channel is formed between source and drain. Next, signals T1 and T5 restore bus interconnections. If $I_{BUS}$ and $O_{Bus}$ lines are in tristate mode during bus interrupt, then the transfer gates controlled by signals T1 and T5 are not needed and may be omitted.

Table 1 compares the conventional crossbar switch requiring $n^2$ array connections to control the state of conventional FET switches, with the nanotube crossbar switch requiring 2n array connections to control the state of the NT switches, where n is the bus width. Therefore, the number of array lines scale linearly with the bus size such that two 32 bit buses require a total of 64 array lines and Nanotube Crossbar Switches can be scaled to any size bus. The conventional crossbar switch of FIG. 20 requires 1024 individual switch array connections and is not scalable because of the geometric increases in the required array lines to control the switches.

At least some of the advantages of the Nanotube Crossbar switch (scalability, wireability) are summarized in Table 1.

TABLE 1

| | 4 × 4 CROSSBAR | | 16 × 16 CROSSBAR | | 32 × 32 CROSSBAR | | 64 × 64 CROSSBAR | |
|---|---|---|---|---|---|---|---|---|
| | CONVEN-TIONAL | NANOTUBE | CONVEN-TIONAL | NANOTUBE | CONVEN-TIONAL | NANOTUBE | CONVEN-TIONAL | NANOTUBE |
| # CROSSBAR SWITCHES | 16 | 16 | 256 | 256 | 1024 | 1024 | 4096 | 4096 |
| # CROSSBAR SWITCH CONNECTIONS | 16 ↔ 8 | | 256 ↔ 32 | | 1024 ↔ 64 | | 4096 ↔ 128 | |

In at least some cases, the technique chosen to create a nanofabric must result in a sufficient quantity of nanotubes in contact with other nanotubes which thereby matte as a result of the nanotubes' adhesion characteristics. Certain embodiments (e.g., memory cells) benefit when the nanofabric is very thin (e.g., less than 2 nm); for example, when the nanofabric is primarily a monolayer of nanotubes with sporadic overlapping (sometimes fabric will have portions that are bi-layers or tri-layers), or a multilayer fabric with relatively small diameter nanotubes. Moreover, many of these embodiments benefit when the nanotubes are single-walled nanotubes (SWNTs). Other uses of patterned nanotube ribbons (e.g., conductive traces) may benefit from thicker fabrics or multi-walled nanotubes (MWNTs). Still other uses of patterned nanotube ribbons may benefit from combinations of single-walled nanotubes (SWNTs), and multi-walled nanotubes (MWNTs). For example, long distance wiring traces may be selected for lower wiring impedance using MWNTs, while local wiring and electromechanical switching regions may selected for planarity and electromechanical switching characteristics. The nanofabric is patterned using photolithographic techniques generating an electrically conductive trace of nanotubes.

The following U.S. Patent applications disclose various methods and techniques for making nanotube fabrics and nanotube switching elements that may be used as NT devices of preferred embodiments. The nanotube fabrics are porous and in some instances highly porous. The nanotube fabrics are substantially a monolayer of carbon nanotubes. In certain preferred embodiments, the carbon nanotubes are single-walled carbon nanotubes. Their disclosures are hereby incorporated by reference in their entirety:

"Electromechanical Memory Array Using Nanotube Ribbons and Method for Making Same," U.S. patent application Ser. No. 09/915,093, filed Jul. 25, 2001 (NAN-1);

"Electromechanical Three-Trace Junction Devices," U.S. patent application Ser. No. 10/033,323, filed Dec. 28, 2001 (NAN-4);

"Nanotube Films And Articles," U.S. patent application Ser. No. 10/128,118, filed Apr. 23, 2002 (NAN-6);

"Methods Of Making Carbon Nanotube Films, Layers, Fabrics, Ribbons, Elements And Articles," U.S. patent application Ser. No. 10/341,005, filed Jan. 13, 2003 (NAN-15);

"Devices Having Horizontally-Disposed Nanofabric Articles And Methods Of Making The Same," U.S. patent application Ser. No. 10/776,059, filed Feb. 11, 2004 (NAN-19).

"Devices Having Vertically-Disposed Nanofabric Articles And Methods Of Making "The Same," U.S. patent application Ser. No. 10/776,572, filed Feb. 11, 2004 (NAN-20).

Other embodiments may employ double-walled nanotubes, including such nanotubes with metallic properties.

The preferred embodiment uses electrostatic attractive forces to deflect the nanotube element, but other embodiments may use repulsive forces.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A voltage distribution system, the system comprising:
a plurality of voltage sources providing a plurality of voltages;
a plurality of input buses carrying the plurality of voltages;
a plurality of output buses in contact with a plurality of circuit elements;
an array of nanotube switches;
input interrupt circuitry positioned between the plurality of input buses and the array of nanotube switches;
output interrupt circuitry positioned between the plurality of output buses and the array of nanotube switches; and
control circuitry in communication with the input interrupt circuitry, the output interrupt circuitry, and the array of nanotube switches, and constructed and arranged to apply:
disconnect signals to the input interrupt circuitry and the output interrupt circuitry to disconnect the array of nanotube switches from the plurality of input buses and from the plurality of output buses;
programming signals to the array of nanotube switches to program the nanotube switches to route at least one voltage from at least one input bus to at least one output bus; and
reconnect signals to the input interrupt circuitry and the output interrupt circuitry to connect the array of programmed nanotube switches to the plurality of input buses and to the plurality of output buses.

2. The system of claim 1, wherein at least one voltage source comprises a logic signal generator.

3. The system of claim 1, wherein at least one voltage source comprises a clock signal generator.

4. The system of claim 1, wherein at least one voltage source comprises a power source.

5. The system of claim 4, wherein each nanotube switching element of the array has a length to width ratio of between about 5:1 and about 50:1.

6. The system of claim 1, wherein each voltage is smaller than a threshold voltage needed to switch the nanotube switches of the array.

7. The system of claim 1, wherein each nanotube switch comprises a source, a drain, a channel region between the source and the drain, and a floating gate comprising a nanotube element configured and arranged to allow a voltage to flow through the channel region in response to a capacitance generated by the control signals.

8. The system of claim 7, further comprising a plurality of bit lines connected to the control circuitry and a plurality of switch lines that are substantially perpendicular to the plurality of bit lines and connected to the control circuitry, wherein one of the source and the drain of each nanotube switch of the array is connected to a bit line, and wherein the nanotube element of each nanotube switch is connected to a switch line.

9. The system of claim 8, wherein each switch line comprises a nanotube ribbon, and wherein the nanotube element of each nanotube switch connected to that switch line is a portion of the nanotube ribbon.

10. The system of claim 8, further comprising a plurality of release lines in contact with the control circuitry, wherein each nanotube switch further comprises a release electrode configured and arranged to deflect the nanotube element to inhibit a voltage from flowing through the channel.

11. The system of claim 10, wherein the programming signals program the array of nanotube switches by applying an ON signal to the switch lines of all the nanotube switches, and then applying partial select signals to the release lines of a subset of the nanotube switches, the switches excluded from said subset routing the at least one voltage from the at least one input bus to the at least one output bus.

12. The system of claim 1, wherein each nanotube switch of the array nonvolatilely maintains its programming.

13. A current distribution system, the system comprising:
a plurality of current sources providing a plurality of currents;
a plurality of input buses carrying the plurality of currents;
a plurality of output buses in contact with a plurality of circuit elements;
an array of nanotube switches;
input interrupt circuitry positioned between the plurality of input buses and the array of nanotube switches;
output interrupt circuitry positioned between the plurality of output buses and the array of nanotube switches; and
control circuitry in communication with the input interrupt circuitry, the output interrupt circuitry, and the array of nanotube switches, and constructed and arranged to apply:
　disconnect signals to the input interrupt circuitry and the output interrupt circuitry to disconnect the array of nanotube switches from the plurality of input buses and from the plurality of output buses;
　programming signals to the array of nanotube switches to program the nanotube switches to route at least one current from at least one input bus to at least one output bus; and
　reconnect signals to the input interrupt circuitry and the output interrupt circuitry to connect the array of programmed nanotube switches to the plurality of input buses and to the plurality of output buses.

14. The system of claim 13, wherein at least one current source comprises a logic signal generator.

15. The system of claim 13, wherein at least one current source comprises a clock signal generator.

16. The system of claim 13, wherein at least one current source comprises a power source.

17. The system of claim 16, wherein each nanotube switching element of the array has a length to width ratio of between about 5:1 and about 50:1.

18. The system of claim 13, wherein each nanotube switch comprises a source, a drain, a channel region between the source and the drain, and a floating gate comprising a nanotube element configured and arranged to allow a current to flow through the channel region in response to a capacitance generated by the control signals.

19. The system of claim 18, further comprising a plurality of bit lines in contact with the control circuitry and a plurality of switch lines that are substantially perpendicular to the plurality of bit lines and are in contact with the control circuitry, wherein one of the source and the drain of each nanotube switch of the array is connected to a bit line, and wherein the nanotube element of each nanotube switch is connected to a switch line.

20. The system of claim 19, wherein each switch line comprises a nanotube ribbon, and wherein the nanotube element of each nanotube switch connected to that switch line is a portion of the nanotube ribbon.

21. The system of claim 19, further comprising a plurality of release lines in contact with the control circuitry, wherein each nanotube switch further comprises a release electrode configured and arranged to deflect the nanotube element to inhibit a current from flowing through the channel.

22. The system of claim 21, wherein the programming signals program the array of nanotube switches by applying an ON signal to the switch lines of all the nanotube switches, and then applying partial select signals to the release lines of a subset of the switches, the switches excluded from said subset routing the at least one current from the at least one input bus to the at least one output bus.

23. The system of claim 13, wherein each nanotube switch of the array nonvolatilely maintains its programming.

* * * * *